(12) United States Patent
Kim et al.

(10) Patent No.: US 12,373,681 B2
(45) Date of Patent: Jul. 29, 2025

(54) NEUROMORPHIC METHOD AND APPARATUS WITH MULTI-BIT NEUROMORPHIC OPERATION

(71) Applicant: Samsung Electronics Co., Ltd., Suwon-si (KR)

(72) Inventors: Sungho Kim, Yongin-si (KR); Cheheung Kim, Yongin-si (KR); Jaeho Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/508,519

(22) Filed: Nov. 14, 2023

(65) Prior Publication Data
US 2024/0086694 A1    Mar. 14, 2024

Related U.S. Application Data

(63) Continuation of application No. 16/556,424, filed on Aug. 30, 2019, now Pat. No. 11,868,870.

(30) Foreign Application Priority Data

Sep. 3, 2018    (KR) .................. 10-2018-0104736

(51) Int. Cl.
*G06N 3/063*    (2023.01)
*G06F 7/501*    (2006.01)
(Continued)

(52) U.S. Cl.
CPC ............ *G06N 3/063* (2013.01); *G06F 7/501* (2013.01); *G06F 7/523* (2013.01); *G11C 11/54* (2013.01)

(58) Field of Classification Search
CPC  G06N 3/063; G06N 3/04; G06N 3/08; G06N 3/06; G06F 7/501; G06F 7/523; G11C 11/54
See application file for complete search history.

(56) References Cited

U.S. PATENT DOCUMENTS 5,630,024 A * 5/1997 Aihara .................. G06N 3/048
                                                                    706/41
6,434,541 B1    8/2002 Tawel et al.
(Continued)

FOREIGN PATENT DOCUMENTS

CN    105095967 A    11/2015

OTHER PUBLICATIONS

Chinese Office Action issued on Apr. 8, 2024, in counterpart Chinese Patent Application No. 201910821984.2 (26 pages in English, 25 pages in Chinese).

*Primary Examiner* — Kamran Afshar
*Assistant Examiner* — Brian J Hales
(74) *Attorney, Agent, or Firm* — NSIP Law

(57) ABSTRACT

A neuromorphic apparatus configured to process a multi-bit neuromorphic operation including a single axon circuit, a single synaptic circuit, a single neuron circuit, and a controller. The single axon circuit is configured to receive, as a first input, an i-th bit of an n-bit axon. The single synaptic circuit is configured to store, as a second input, a j-th bit of an m-bit synaptic weight and output a synaptic operation value between the first input and the second input. The single neuron circuit is configured to obtain each bit value of a multi-bit neuromorphic operation result between the n-bit axon and the m-bit synaptic weight, based on the output synaptic operation value. The controller is configured to respectively determine the i-th bit and the j-th bit to be sequentially assigned for each time period of different time periods to the single axon circuit and the single synaptic circuit.

20 Claims, 28 Drawing Sheets

<MATHEMATICAL MODEL OF BIOLOGICAL NEURON>

(51) Int. Cl.
    *G06F 7/523*       (2006.01)
    *G11C 11/54*     (2006.01)

(56) References Cited

U.S. PATENT DOCUMENTS

| | | |
|---|---|---|
| 8,868,477 B2 | 10/2014 | Esser et al. |
| 9,418,333 B2 | 8/2016 | Kim et al. |
| 9,818,058 B2 | 11/2017 | Arthur et al. |
| 2013/0031039 A1 | 1/2013 | Sim et al. |
| 2017/0185890 A1 | 6/2017 | Yasuda et al. |
| 2018/0101935 A1 | 4/2018 | Andreopoulos et al. |
| 2019/0042920 A1* | 2/2019 | Akin .................. G06N 3/049 |
| 2020/0074284 A1 | 3/2020 | Kim et al. |

* cited by examiner

<MATHEMATICAL MODEL OF BIOLOGICAL NEURON>

$$\begin{array}{r}ABC_2 \quad \text{—— 611}\\ \underline{\times DEF_2} \quad \text{—— 612}\\ \underline{GHI} \quad \text{—— 613}\\ \underline{JKL} \quad \text{—— 614}\\ \underline{MNO} \quad \text{—— 615}\\ PQRSTU_2 \quad \text{—— 616}\end{array}$$

① $T = t_0$

② $T = t_1 \,\&\, t_2$

⑥ $T = t_7$

Ex) $w = 111_2$, $A = 111_2$ $$\begin{array}{r} 111_2 \\ \times\ 111_2 \\ \hline 111 \\ 111\phantom{0} \\ 111\phantom{00} \\ \hline 110001_2 \end{array}$$

Ex) $w = 111_2$, $A = 010_2$ $$\begin{array}{r} 111_2 \\ \times\ 010_2 \\ \hline 000 \\ 111\phantom{0} \\ 000\phantom{00} \\ \hline 001110_2 \end{array}$$

$001110_2$

Ex) w = $001_2$, A = $100_2$ $$\begin{array}{r} 001_2 \\ \times\, 100_2 \\ \hline 000 \\ 000\phantom{0} \\ 001\phantom{00} \\ \hline 000100_2 \end{array}$$

$000100_2$

NEUROMORPHIC METHOD AND APPARATUS WITH MULTI-BIT NEUROMORPHIC OPERATION

CROSS-REFERENCE TO RELATED APPLICATION

This application is a Continuation Application of U.S. patent application Ser. No. 16/556,424, filed on Aug. 30, 2019, which claims the benefit under 35 USC 119(a) of Korean Patent Application No. 10-2018-0104736, filed on Sep. 3, 2018, in the Korean Intellectual Property Office, the entire disclosure of which is incorporated herein by reference for all purposes.

BACKGROUND

1. Field

The present disclosure relates to a neuromorphic method and apparatus with multi-bit neuromorphic operation.

2. Description of the Related Art

Neuromorphic processors are specialized computing hardware processors that include a neuron circuit and a synapse circuit. As only an example, the neuron circuit may generate activations or processing results, or signals corresponding to such activations or processing results, with respect to other activations or processing results (or corresponding signals) of the neuron circuit, e.g., in a hierarchical manner to generate an overall result. The synapse circuit may be configured to provide connections between nodes or processing devices (e.g., processing units) of the neuron circuit. Such a neuromorphic processor may be used to drive various neural networks such as convolutional neural networks (CNNs), recurrent neural networks (RNNs), and feedforward neural networks (FNNs), as non-limiting example, and such as in fields of data classification or image recognition, also as non-limiting examples.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a neuromorphic apparatus configured to process a multi-bit neuromorphic operation, the neuromorphic apparatus includes a single axon circuit, a single synaptic circuit, a single neuron circuit, and a controller. The single axon circuit is configured to receive, as a first input, an i-th bit of an n-bit axon. The single synaptic circuit is configured to store, as a second input, a j-th bit of an m-bit synaptic weight and output a synaptic operation value between the first input and the second input. The single neuron circuit is configured to obtain each bit value of a multi-bit neuromorphic operation result between the n-bit axon and the m-bit synaptic weight, based on the output synaptic operation value. The controller is configured to respectively determine the i-th bit and the j-th bit to be sequentially assigned for each time period of different time periods to the single axon circuit and the single synaptic circuit, to obtain the multi-bit neuromorphic operation result from a lower bit value to an upper bit value, wherein n and m are each a natural number, i is a natural number between 1 and n, and j is a natural number between 1 and m.

The controller may be further configured to map i and j such that the i-th bit and the j-th bit are combined differently for the different time periods.

The controller may be further configured to sequentially change values of i and j of the i-th bit and the j-th bit in an ascending bit value order.

The total number of combinations of the i-th bit and the j-th bit may correspond to a value obtained by multiplying n by m.

The single axon circuit and the single synaptic circuit may each process a single bit value for the different time periods.

The single neuron circuit may include a single adder configured to perform an addition operation using synaptic operation values output from the single neuron circuit for the different time periods.

The single neuron circuit may be configured to obtain each bit value of the multi-bit neuromorphic operation result using the single adder to perform an addition operation using, as inputs, at least one of a pre-set initial value, a synaptic operation value output from the single synaptic circuit at a previous time period of the different time periods, a synaptic operation value output from the single synaptic circuit at a current time period of the different time periods, an addition value processed by the single adder at a previous time period of the different time periods, and a carry value determined by the single adder at a previous time period of the different time periods.

At least one of an addition value and a carry value output from the single adder may correspond to a value of one of bits of the multi-bit neuromorphic operation result.

The single adder may be reused to obtain a value of another one of bits of the multi-bit neuromorphic operation result after a value of one of the bits indicating the multi-bit neuromorphic operation result is obtained.

The single adder may be further configured to perform the addition operation by receiving, as inputs, synaptic operation values corresponding to the same bit positions between intermediate products for obtaining the multi-bit neuromorphic operation result.

The controller may be further configured to determine the first input and the second input that are to be assigned at each time period such that bits indicating the multi-bit neuromorphic operation result are sequentially obtained by the single neuron circuit from a value of a least significant bit (LSB) to a value of a most significant bit (MSB).

The single neuron circuit may be further configured to determine whether to output a spike by comparing the multi-bit neuromorphic operation result with a pre-set threshold value upon receipt of each bit of the multi-bit neuromorphic operation result.

In another general aspect, a multi-bit neuromorphic operation method includes determining, as a first input, an i-th bit of an n-bit axon to be sequentially assigned to a single axon circuit for each time period of different time periods; determining, as a second input, a j-th bit of an m-bit synaptic weight to be assigned to a single synaptic circuit for each of the different time periods; receiving the determined first input from the single axon circuit; storing the determined second input in the single synaptic circuit and outputting a synaptic operation value as a function between the first input and the second input; and obtaining, by a single neuron circuit, each bit value of a multi-bit neuromorphic operation result between the n-bit axon and the m-bit synaptic weight, based on the output synaptic operation value. The first input and the second input are determined for the different time periods until the multi-bit neuromorphic operation result is obtained sequentially from a lower bit value to an upper bit value. The n and m are each a natural number, i is a natural number between 1 and n, and j is a natural number between 1 and m.

The i and j may be determined such that the i-th bit and the j-th bit are combined differently for each time period of different time periods.

Values of i of the i-th bit and j of the j-th bit may be sequentially changed in an ascending bit value order.

A total number of combinations of the i-th bit and the j-th bit may correspond to a value obtained by multiplying n by m.

The obtaining may include obtaining the each bit value based on an addition operation of a single adder using synaptic operation values output from the single neuron circuit at different times.

The obtaining may include obtaining the each bit value of the multi-bit neuromorphic operation result using the single adder to perform an addition operation using, as inputs, at least one of a pre-set initial value, a synaptic operation value output from the single synaptic circuit at a previous time period of the different time periods, a synaptic operation value output from the single synaptic circuit at a current time period of the different time periods, an addition value processed by the single adder at a previous time period of the different time periods, and a carry value determined by the single adder at a previous time period of the different time periods.

At least one of an addition value and a carry value output from the single adder may correspond to a value of one of bits indicating the multi-bit neuromorphic operation result.

The obtaining may include obtaining a value of another one of bits indicating the multi-bit neuromorphic operation result after a value of one of the bits indicating the multi-bit neuromorphic operation result is obtained.

The obtaining may further include performing the addition operation by receiving, as inputs of the single adder, synaptic operation values corresponding to the same bit positions between intermediate products for obtaining the multi-bit neuromorphic operation result.

The first input and the second input that are to be assigned at each time period of the different time periods may be determined such that bits indicating the multi-bit neuromorphic operation result are sequentially obtained by the single neuron circuit from a value of a least significant bit (LSB) to a value of a most significant bit (MSB).

The method may further include determining, by the single neuron circuit, whether to output a spike by comparing the multi-bit neuromorphic operation result with a pre-set threshold value upon receipt of each bit of the multi-bit neuromorphic operation result.

A non-transitory computer-readable recording medium having recorded thereon a program which, when executed by a computer, performs the method according to an aspect of the disclosure.

In another general aspect, a neuromorphic processor includes a controller. The controller is configured, for each time period of time periods, to sequentially determine: one bit of n-bits to assign to a single axon circuit; one bit of m-bits to assign to a single synaptic circuit configured to output a synaptic operation value as a function of the one bit of n-bits and the one bit of m-bits; and one of each bit value of a multi-bit neuromorphic operation result between the one bit of n-bits and the one bit of m-bits based on the output synaptic operation value for a single neuron circuit. The controller accumulates the multi-bit neuromorphic operation result for each time period of time periods of n-bits and of m-bits in a byte order, and n and m are each a natural number.

The n-bits and m-bits may be stored in an external memory.

A neuromorphic chip may include the neuromorphic processor.

The neuromorphic chip may further include the external memory.

The single neuron circuit may include a single adder and a comparator.

The single adder may be configured to receive an initial value as an augend, the synaptic operation value as an addend, and the initial value as a previous carry value during a first time period of time periods.

The single adder may be configured to perform an addition operation to output an addition value and a carry value, wherein the addition value corresponds to a least significant bit (LSB) of the multi-bit neuromorphic operation result and the carry value is input as a previous carry value of an addition operation to be performed in a second time period of time periods.

The single adder may be further configured to, for the second time period, perform another addition operation to output another addition value and another carry value, wherein the another addition value corresponds to another bit value of the multi-bit neuromorphic operation result and the another carry value is input as another previous carry value of a subsequent addition operation to be performed in a third time period of time periods.

The neuromorphic processor may be included in an electronic device for driving a neural network.

In another general aspect, a neuromorphic processor includes: an axon circuit; a synaptic circuit connected to the axon circuit; and a neuron circuit connected to the synaptic circuit and comprising an adder, wherein the neuron circuit is configured to perform a multiplication operation between a multi-bit activation input input to the axon circuit and a multi-bit synaptic weight input input to the synaptic circuit through respective uses of the adder in a time-division manner.

The adder may be a full adder.

The adder may be a single adder.

The neuromorphic processor may further include a controller configured to control the time-division manner.

In another general aspect, a neuromorphic apparatus includes: a neuromorphic processor including an axon circuit, a synaptic circuit connected to the axon circuit, and a neuron circuit connected to the synaptic circuit and comprising an adder; and a memory storing data processed by the neuromorphic processor, wherein the neuromorphic processor performs a multiplication operation between a multi-bit activation input input to the axon circuit and a multi-bit synaptic weight input input to the synaptic circuit through respective uses of the adder included in the neuron circuit in a time-division manner.

The neuromorphic processor may further include a controller configured to determine an i-th lower bit of the multi-bit activation input and a j-th lower bit of the multi-bit synaptic weight input, which are to be processed by the adder in the time-division manner, to be combined differently.

The the axon circuit and the synaptic circuit may respectively correspond to a single axon circuit and a single synaptic circuit, which process a value of a single bit.

The memory may store the multi-bit activation input to be provided to the axon circuit, the multi-bit synaptic weight input to be provided to the synaptic circuit, and a result of performing the multiplication operation.

Other features and aspects will be apparent from the following detailed description, the drawings, and the claims.

BRIEF DESCRIPTION OF THE DRAWINGS

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Figure 1:
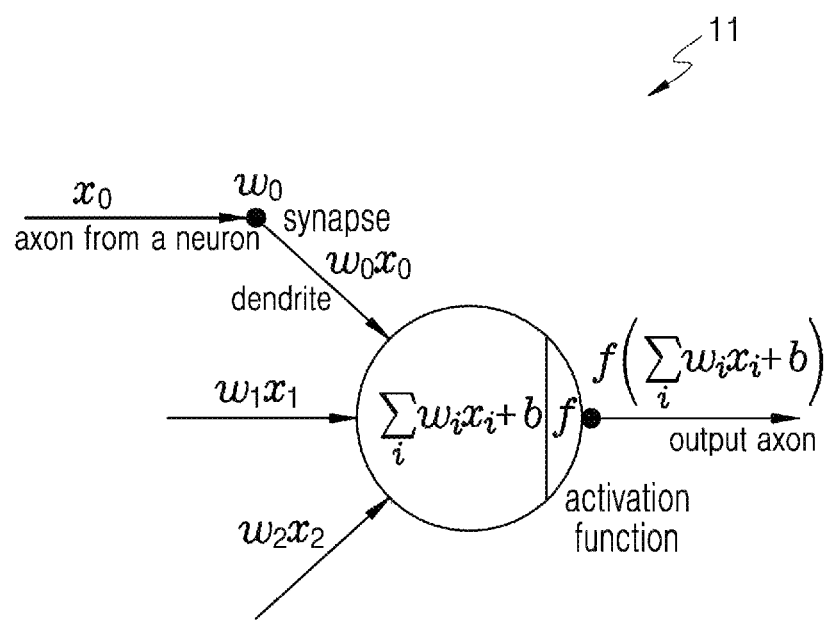
FIG. 1 is a diagram of an example of a mathematical model related to an operation of a biological neuron.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Unless otherwise defined, all terms, including technical and scientific terms, used herein have the same meaning as commonly understood in the art to which this disclosure of this application pertains in the context of and based on an understanding of this disclosure of this application. Terms, such as those defined in commonly used technical dictionaries, are to be interpreted as having a meaning that is consistent with their meaning in the context of the relevant art and consistent with the disclosure of this application, and are not to be interpreted in an idealized or overly formal sense unless expressly so defined herein.

In the specification, when a region is "connected" to another region, the regions may not only be "directly connected," but may also be "electrically connected" via another device therebetween. Also, when a part "includes" or "comprises" an element, unless there is a particular description contrary thereto, the part may further include other elements, not excluding the other elements.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

As used herein, the term "and/or" includes any and all combinations of one or more of the associated listed items. Expressions such as "at least one of," when preceding a list of elements, modify the entire list of elements and do not modify the individual elements of the list.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram of an example of a mathematical model 11 stimulating an operation of a biological neuron.

A biological neuron may be simulated by the mathematical model 11. The mathematical model 11 is an example of a neuromorphic operation that may be simulated by a hardware computational element or processor, and may include a multiplication operation in which a synaptic weight is multiplied with respect to information from a plurality of neurons, an addition operation Σ with respect to values $\omega_0 x_0$, $\omega_1 x_1$, and $\omega_2 \omega_2$ to which the respective synaptic weights are multiplied, and an operation in which a characteristic function bias (b) and an activation function f are applied with respect to an addition operation result. A simulated neuromorphic operation result may be provided via the disclosed neuromorphic operation where values of $x_0$, $x_1$, $x_2$, etc. may correspond to simulated axon values and values of $\omega_0$, $\omega_1$, $\omega_2$, etc. may correspond to simulated synaptic weights. Herein, it is noted that use of the term "may" with respect to an example or embodiment, e.g., as to what an example or embodiment may include or implement, means that at least one example or embodiment exists in which such a feature is included or implemented while all examples and embodiments are not limited to these examples.

Figure 2:
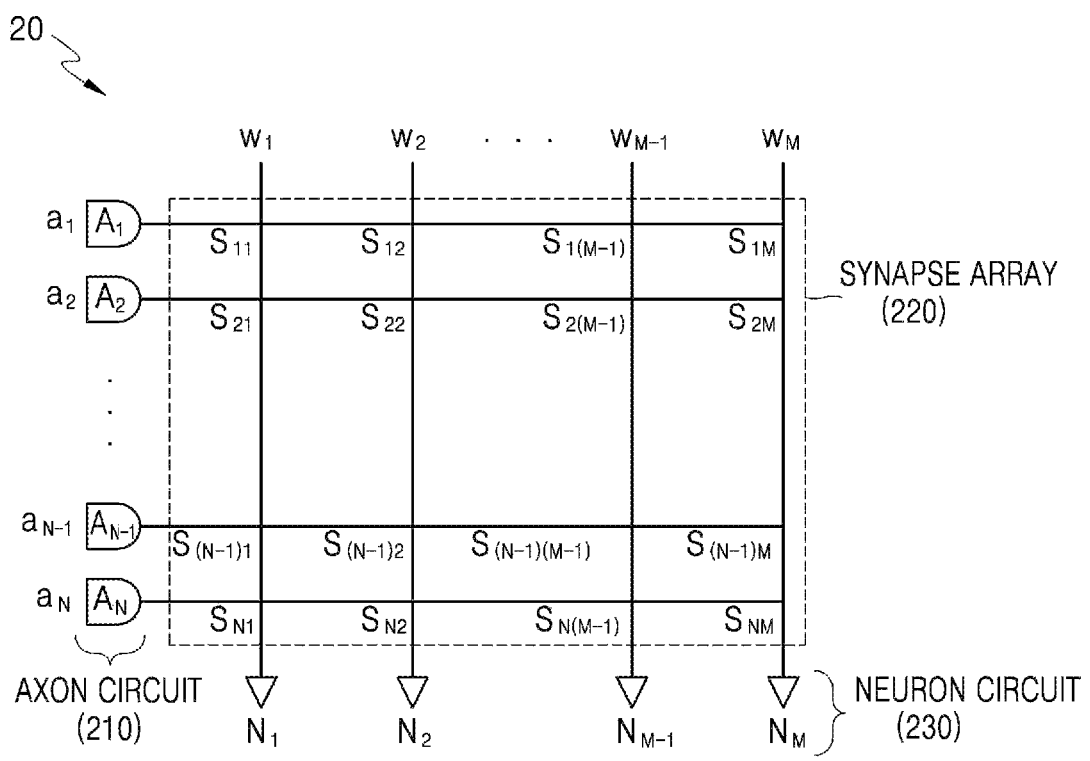
FIG. 2 is a diagram of an example configuration of a two-dimensional (2D) array circuit performing a neuromorphic operation.

FIG. 2 is a diagram of an example configuration 20 of a 2-dimensional (2D) array circuit for performing a neuromorphic operation.

Referring to FIG. 2, the configuration 20 of the 2D array circuit includes N axon circuits $A_1$ through $A_N$ 210, M neuron circuits $N_1$ through $N_M$ 230, and N×M synapse arrays $S_{11}$ through $S_{NM}$ 220, wherein N and M are each an arbitrary natural number. Herein, with respect to examples and descriptions of FIGS. 1-15, as well as remaining examples, the Summary, and the claims, the use of the term "neuron" is not meant to mean that the "neuron" has any other meaning beyond a technological meaning, i.e., it is not meant to mean that that the term "neuron" hereinafter is structurally and operatively the same or analogous in hardware and hardware implementation with respect to chemical and neurological neuron implementations. Similarly, with the terms "neuron circuit", "synapse", "synapse circuit", "axon", or "axon circuit" with respect to examples and descriptions of FIGS. 1-15, as well as remaining examples, the Summary, and the claims, the use of the term "neuron", "synapse", "axon", or "axon circuit" is not meant to mean that the "neuron", "synapse", "axon", or "axon circuit" have any other meaning beyond a technological meaning, i.e., it is not meant to mean that that the term "neuron", "synapse", "axon", or "axon circuit" hereinafter is structurally and operatively the same or analogous in hardware and hardware implementation with respect to chemical and neurological neuron implementations. For example, an artificial neural network may be hardware that is configured to have multiple layers of hardware nodes, i.e., referred as such "neurons" below.

Each synapse of the synapse arrays $S_{11}$ through $S_{NM}$ 220 may be arranged at intersections of first direction lines extending in a first direction from the axon circuits $A_1$ through $A_N$ 210 and second direction lines extending in a second direction from the neuron circuits $N_1$ through $N_M$ 230.

Here, for the convenience of description, the first direction is a row direction and the second direction is a column direction, but the first and second directions are not limited to these examples, and the first direction may be a column direction and the second direction may be a row direction, as a non-limiting example.

Each of the axon circuits $A_1$ through $A_N$ 210 may receive and transmit an activation (for example, axons $a_1$ through $a_n$) to the first direction lines. The activation corresponds to a neurotransmitter transmitted through a neuron and may denote an electric signal input to each of the axon circuits $A_1$ through $A_N$ 210. Meanwhile, each of the axon circuits $A_1$ through $A_N$ 210 may include a memory, register, or buffer for storing input information. Meanwhile, the activation may be binary activation having a binary value. For example, the binary activation may include 1-bit information corresponding to a logic value 0 or 1. However, the activation is not limited to these examples, and may have a ternary value or a multi-bit value.

Each of the synapse arrays $S_{11}$ through $S_{NM}$ 220 may store a synaptic weight corresponding to a connection strength between neurons. In FIG. 2, for the convenience of description, $w_1$ through $w_m$ are illustrated as examples of the synaptic weights to be stored in each synapse, but other synaptic weights may further be stored in each synapse. Each synapse of the synapse arrays $S_{11}$ through $S_{NM}$ 220 may include a memory device for storing the synaptic weight or may be connected to another memory device storing the synaptic weight. Here, such a memory device may be, for example, a memristor.

Each of the synapse arrays $S_{11}$ through $S_{NM}$ 220 may receive an activation input transmitted from each of the axon circuits $A_1$ through $A_N$ 210 through a corresponding first direction line or may output a result of a neuromorphic operation between the activation input and the stored synaptic weight. For example, the neuromorphic operation between the activation input and the synaptic weight may be a multiplication operation (i.e., AND operation), but is not limited to this example. In other words, the result of the neuromorphic operation between the activation input and the synaptic weight may be a value obtained via another arbitrary suitable operation for reflecting strength or size of activations adjusted based on connection strengths between neurons.

The size or strength of a signal transmitted from the axon circuits $A_1$ through $A_N$ 210 to the neuron circuits $N_1$ through $N_M$ 230 may be adjusted according to the neuromorphic operation between the activation input and the synaptic weight. As such, an operation of adjusting the size or strength of a signal transmitted to a next neuron, according to connection strength between neurons, may be implemented using the synapse arrays $S_{11}$ through $S_{NM}$ 220.

Each of the neuron circuits $N_1$ through $N_M$ 230 may receive the result of the neuromorphic operation between the activation input and the synaptic weight through a respective second direction line. Each of the neuron circuits $N_1$ through $N_M$ 230 may determine whether to output a spike based on the result of the neuromorphic operation. For example, each of the neuron circuits $N_1$ through $N_M$ 230 may output a spike when an accumulated value of the results of the neuromorphic operation is equal to or greater than a pre-set threshold value. The spikes output from the neuron circuits $N_1$ through $N_M$ 230 may correspond to activation input to axon circuits of a next stage.

The neuron circuits $N_1$ through $N_M$ 230 are located at the rear end of the synapse arrays $S_{11}$ through $S_{NM}$ 220, and thus, may be referred to as post-synaptic neuron circuits. The axon circuits $A_1$ through $A_N$ 210 are located at the front end of the synapse arrays $S_1$ through $S_{NM}$ 220, and thus, may be referred to as pre-synaptic neuron circuits.

Figure 3A:
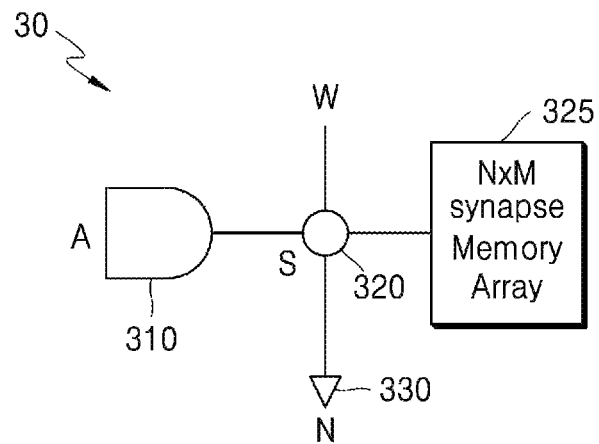
FIG. 3A is a diagram of an example of symbols for describing components of a neuromorphic processor in a neuromorphic apparatus.

FIG. 3A is a diagram of an example of symbols for describing components of a neuromorphic processor 30 in a neuromorphic apparatus.

Referring to FIG. 3A, the neuromorphic processor 30 may include a single axon circuit 310, a single synaptic circuit 320, and a single neuron circuit 330. Here, the single synaptic circuit 320 may receive synaptic weights from an N×M synapse memory array 325 included in another external memory device.

The configuration of the 2D array (N×M) circuit described with reference to FIG. 2 may be embodied using the single axon circuit 310, the single synaptic circuit 320, and/or the single neuron circuit 330 of FIG. 3A, for example. The axon circuits $A_1$ through $A_N$ 210 of FIG. 2 may correspond to the single axon circuit 310, the synapse arrays $S_{11}$ through $S_{NM}$ 220 correspond to the single synaptic circuit 320, and/or the neuron circuits $N_1$ through $N_M$ 230 correspond to the single neuron circuit 330, for example.

In order to operate like the axon circuits $A_1$ through $A_N$ 210 of FIG. 2, the single axon circuit 310 processes axon inputs in a time-division manner in the neuromorphic processor 30. Also, similarly, in order to operate like the synapse arrays $S_{11}$ through $S_{NM}$ 220 of FIG. 2, the single synaptic circuit 320 may store synaptic weights in a time-division manner in the neuromorphic processor 30.

For example, the single axon circuit 310 may operate as the axon circuit $A_1$ of FIG. 2 at a time $t_1$, operate as the axon circuit $A_2$ of FIG. 2 at a time $t_2$, so on, and then operate as the axon circuit $A_N$ of FIG. 2 at a time $t_N$. Also, the single synaptic circuit 320 may operate as the synapse $S_{11}$ of FIG. 2 at a time $t_{1-1}$, operate as the synapse $S_{12}$ of FIG. 2 at a time $t_{1-2}$, so on, and then operate as the synapse $S_{NM}$ of FIG. 2 at a time $t_{N-M}$. Meanwhile, the single neuron circuit 330 may also operate as the neuron circuits $N_1$ through $N_M$ 230 in the same manner. Here, times are all arbitrary times and are denoted by different reference numerals so as to be distinguishable.

As such, when each of the single axon circuit 310, the single synaptic circuit 320, and the single neuron circuit 330 operates at specific time points or periods in a time-division manner, the neuromorphic processor 30 may operate as if a plurality of circuits N×M are operating, even when only a single circuit (1×1) is included. In other words, the configuration 20 of the 2D array (N×M) circuit of FIG. 2 may be embodied as the neuromorphic processor 30 of single circuits (1×1) by operating each single circuit in a time-division manner.

Figure 3B:
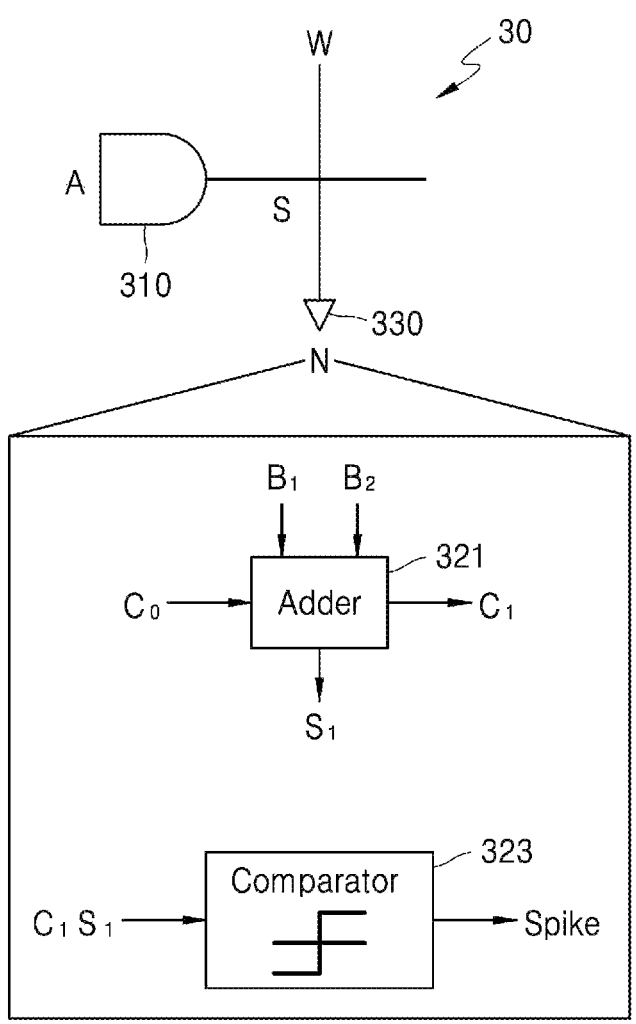
FIG. 3B is a diagram of an example of symbols for describing components of a single neuron circuit of a neuromorphic processor.

FIG. 3B is a diagram of an example of symbols for describing components of the single neuron circuit 330 of the neuromorphic processor 30.

Referring to FIG. 3B, the single neuron circuit 330 of the neuromorphic processor 30 may include a single adder 321 and a comparator 323.

The single adder 321 may denote a combination circuit having three inputs of an augend $B_1$, an addend $B_2$, and a previous carry digit $C_0$, and two outputs of a non-carry sum $S_1$ and a new carry digit $C_1$. In other words, the single adder 321 may correspond to a full adder.

The comparator 323 compares an addition result $C_1S_1$ by the single adder 321 and a pre-set threshold value. Here, the pre-set threshold value corresponds to a criterion for determining whether to output a spike to a next neuron. When the comparator 323 determines that the addition result $C_1S_1$ is equal to or greater than the pre-set threshold value, the single neuron circuit 330 may output a spike.

Figure 4:
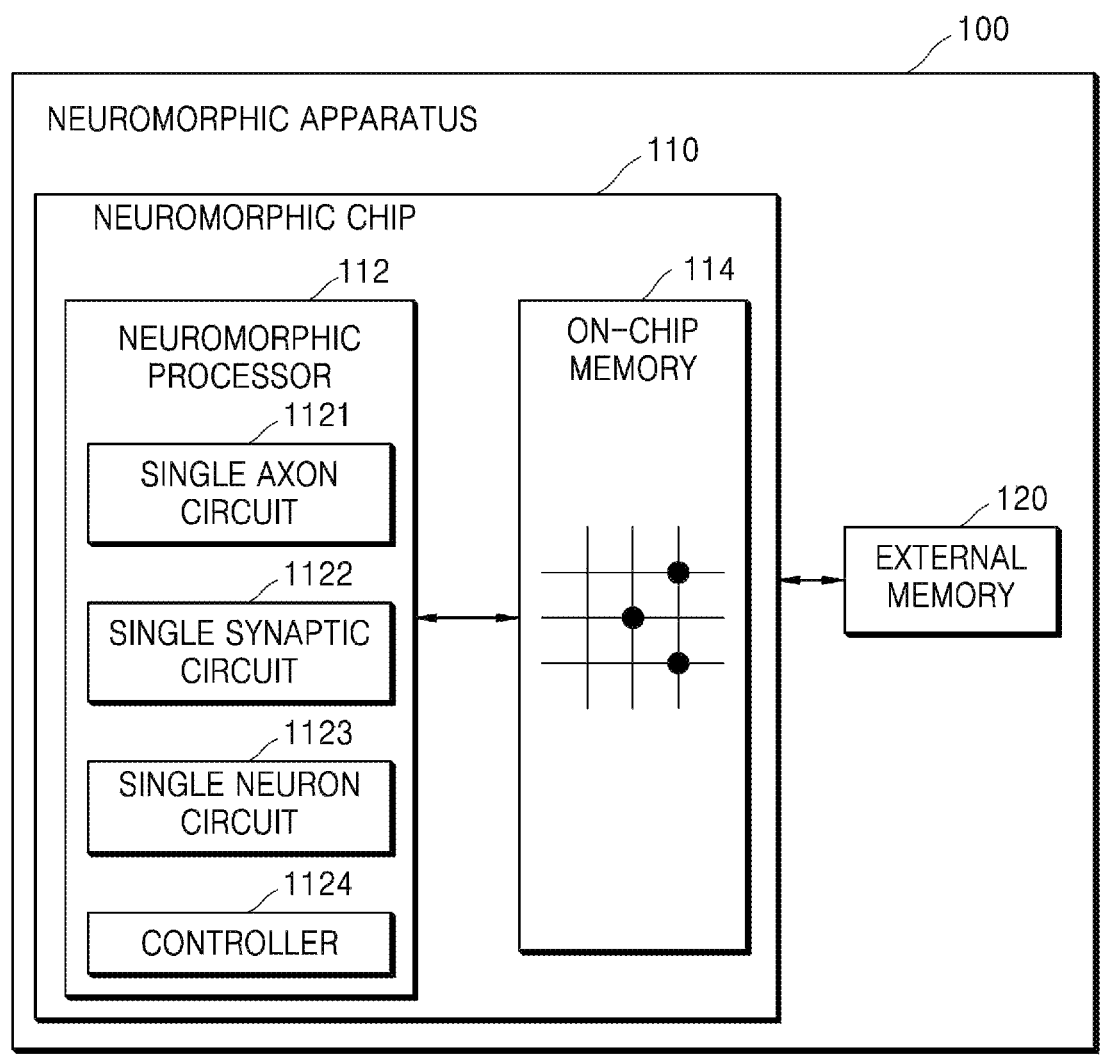
FIG. 4 is a block diagram of an example of a hardware configuration of a neuromorphic apparatus.

FIG. 4 is a block diagram of an example of a hardware configuration of a neuromorphic apparatus 100.

Referring to FIG. 4, the neuromorphic apparatus 100 includes a neuromorphic chip 110 on which a neuromorphic processor 112 and an on-chip memory 114 are mounted, and an external memory 120. The neuromorphic processor 112 includes a single axon circuit 1121, a single synaptic circuit 1122, a single neuron circuit 1123, and a controller 1124. However, FIG. 4 only illustrates components of the neuromorphic apparatus 100 related to the current example. Thus, example also includes the neuromorphic apparatus 100 further including other general-purpose components, such as a central processing unit (CPU), a graphics processing unit (GPU), an application processor (AP), a sensor module, and a communication module, in addition to the components shown in FIG. 4.

The neuromorphic processor 112, the single axon circuit 1121, the single synaptic circuit 1122, and the single neuron circuit 1123 may correspond to the neuromorphic processor 30, the single axon circuit 310, the single synaptic circuit 320, and the single neuron circuit 330 of FIG. 3A, respectively.

The neuromorphic processor 112 may include a single processing unit (or single processor core) embodied as the neuromorphic processor 30 of FIG. 3A, but is not limited to this example, and the neuromorphic processor 112 may include a plurality of processing units (or processor cores) each embodied as the neuromorphic processor 30 of FIG. 3A.

The neuromorphic apparatus 100 may be, or correspond to an apparatus included in various types of electronic devices, such as a server device, a mobile device, and an embedded device. The neuromorphic apparatus 100 may be, or correspond to a hardware component included in a smart phone, a tablet device, an augmented reality (AR) device, an Internet of Things (IoT) device, an automatic driving vehicle, a robotics, or a medical device, which may perform voice recognition, image recognition, image classification, or the like by using a neural network. In other words, the neuromorphic apparatus 100 may be, or correspond to an exclusive hardware (HW) accelerator mounted on such an electronic device, and may be representative of the electronic device, and the neuromorphic apparatus 100 may be an HW accelerator operating like a neural processing unit (NPU), a tensor processing unit (TPU), a neural engine, TrueNorth, or Loihi, which are exclusive modules for neural network driving, but noting examples are not limited to these examples.

The neuromorphic chip 110 may control overall functions for driving a neural network in the neuromorphic apparatus 100. For example, the neuromorphic processor 112 of the neuromorphic chip 110 may control the neuromorphic apparatus 100 in general by accessing neuromorphic data (for example, axon input values, synaptic weight values, or the like) stored in the external memory 120 in the neuromorphic apparatus 100 to execute neuromorphic-related programs. The neuromorphic chip 110 may drive the neural network according to control of CPU, GPU, AP, or the like provided inside or outside the neuromorphic apparatus 100.

The external memory 120 is implemented in hardware and may be used to store various types of neuromorphic data processed in the neuromorphic chip 110 including data processed or to be processed by the neuromorphic chip 110. Also, the external memory 120 may store applications, drivers, etc. to be driven by the neuromorphic chip 110. The external memory 120 may include a random access memory (RAM), such as a dynamic random access memory (DRAM) or a static random access memory (SRAM), a read-only memory (ROM), an electrically erasable programmable read-only memory (EEPROM), CD-ROM, Blue-ray or another optical disk storage, a hard disk drive (HDD), a solid state drive (SSD), or a flash memory.

The on-chip memory 114 of the neuromorphic chip 110 may read, from the external memory 120, and store (or buffer) neuromorphic data (axon values, synapse values, etc.) for pre-synaptic neuron circuits, and execute the neural network by using the stored neuromorphic data—for example, the N×M synapse memory array 325 of FIG. 3A may correspond to the on-chip memory 114. The on-chip memory 114 may store data for post-synaptic neuron circuits, such as spike values, results of neuromorphic operations generated via execution results of the neural network, etc.

Detailed operations and functions of the single axon circuit 1121, the single synaptic circuit 1122, the single neuron circuit 1123, and the controller 1124 will be described in greater detail below with reference to other drawings.

Figure 5:
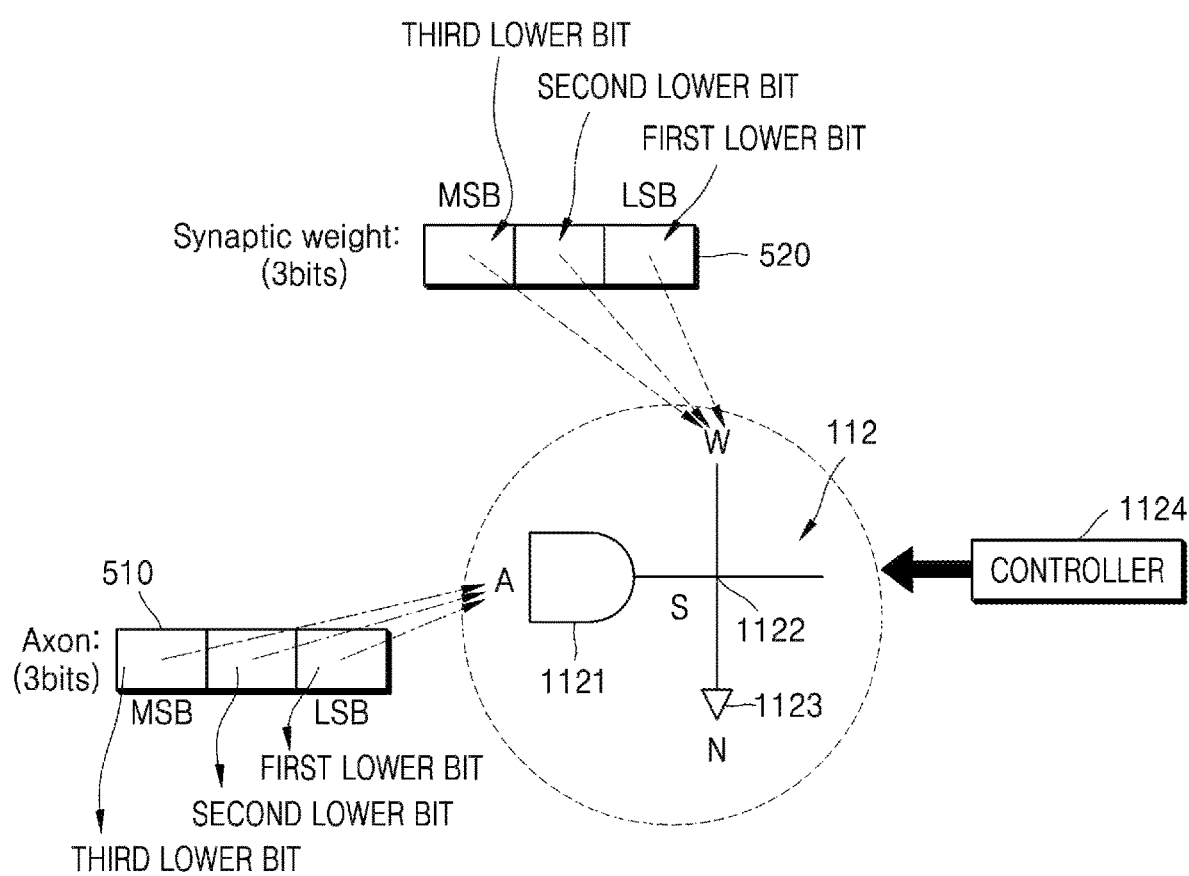
FIG. 5 is a diagram of an example describing inputs of each single circuit of a neuromorphic processor.

FIG. 5 is a diagram of an example describing inputs of each single circuit of the neuromorphic processor 112.

Referring to FIG. 5, the controller 1124 of the neuromorphic processor 112 determines a first input of an i-th lower bit of an n-bit axon 510 to be assigned to the single axon circuit 1121 at each time point, and a second input of a j-th lower bit of an m-bit synaptic weight 520 to be assigned to the single synaptic circuit 1122 at each time point. Here, n and m are each a natural number, wherein i is a natural number between 1 and n and j is a natural number between 1 and m.

In FIG. 5, for the convenience of description, the axon 510 and the synaptic weight 520 each have a value of total 3 bits (n=3 and m=3); however, the axon 510 and the synaptic weight 520 according to the current example may have values of various bits.

The controller 1124 determines a bit value of which bit position (i.e., the i-th lower bit) of the 3-bit axon 510 (n=3) is to be assigned to the single axon circuit 1121 as the first input at which specific time point (for example, a time $t_x$). In other words, the controller 1124 determines i to determine the first input to be assigned at the time $t_x$. For example, i may have a value from 1 to 3. When i is 1, the first input of the first lower bit corresponds to a bit value of a least significant bit (LSB) of the axon 510, and when i is 3, the first input of the third lower bit corresponds to a bit value of a most significant bit (MSB) of the axon 510.

Herein, it is noted that the endianness of the byte order described using MSB and LSB with respect to the examples in this disclosure may be represented in either a big-endian format or little-endian format.

Also, the controller 1124 determines a bit value of which bit position (i.e., the j-th lower bit) of the 3-bit synaptic weight 520 (m=3) is to be assigned to the single synaptic circuit 1122 as the second input at which specific time point (for example, a time $t_y$). In other words, the controller 1124 determines j to determine the second input to be assigned at the time $t_y$. For example, j may have a value from 1 to 3. When j is 1, the second input of the first lower bit corresponds to a bit value of LSB of the synaptic weight 520, and when j is 3, the second input of the third lower bit corresponds to a bit value of MSB of the synaptic weight 520.

As such, the controller 1124 repeatedly determines the first input and the second input to be assigned respectively to the single axon circuit 1121 and the single synaptic circuit 1122 by changing the values of i and j at each time point until a multi-bit neuromorphic operation results from the output of the neuromorphic processor 112 based on the byte order of lower and upper bit values. In this example, the lower bit value may denote a bit value of LSB of the multi-bit neuromorphic operation result and the upper bit value may denote a bit value of MSB of the multi-bit neuromorphic operation result. Meanwhile, the terms first input and second input only denote values of bit positions determined by the controller 1124, wherein the values are newly updated by the controller 1124 at each time point.

The controller 1124 may map i and j such that the i-th lower bit and the j-th lower bit are differently combined at each time point. For example, the controller 1124 may change and map the values of i and j such that combinations from a combination of the i-th lower bit (for example, LSB) and the j-th lower bit (for example, LSB) mapped, such that the summation of i and j is smallest to a combination of the i-th lower bit (for example, MSB) and the j-th lower bit (for example, MSB) mapped such that the summation of i and j is largest, are sequentially assigned to each of the single axon circuit 1121 and the single synaptic circuit 1122. Here, the total number of combinations of the i-th lower bit and the j-th lower bit correspond to a value obtained by multiplying n and m, and in the example of FIG. 5, total 9 (3×3) combinations exist. For example, the controller 1124 may initially map a bit value (first input) of LSB (i=1) of the axon 510 and a bit value (second input) of LSB (j=1) of the synaptic weight 520 at an initial time, and lastly map a bit value (first input) of MSB (i=3) of the axon 510 and a bit value (second input) of MSB (j=3) of the synaptic weight 520 at a last time.

The single axon circuit 1121 of the neuromorphic processor 112 receives the first input of the i-th lower bit of the n-bit axon 510, which is determined by the controller 1124. Also, the single synaptic circuit 1122 of the neuromorphic processor 112 stores the second input of the j-th lower bit of the m-bit synaptic weight 520, which is determined by the controller 1124.

Each of the single axon circuit 1121 and the single synaptic circuit 1122 is a circuit capable of processing a single bit value (i.e., 1 bit value). Accordingly, the single axon circuit 1121 and the single synaptic circuit 1122 may be capable of respectively processing only a bit value (first input) of a certain position of the axon 510 and a bit value (second input) of a certain position of the synaptic weight 520.

When the second input of the j-th lower bit is stored in the single synaptic circuit 1122, the single synaptic circuit 1122 outputs a synaptic operation value between the first input received from the single axon circuit 1121 and the second input stored in the single synaptic circuit 1122. A synaptic operation performed by the single synaptic circuit 1122 may be a multiplication operation (i.e., AND operation) of the first and second inputs, but is not limited to these examples.

The single neuron circuit 1123 of the neuromorphic processor 112 obtains each bit value of the multi-bit neuromorphic operation result between the n-bit axon 510 and the m-bit synaptic weight 520, based on the synaptic operation value output from the single synaptic circuit 1122. This is described in greater detail below with reference to a corresponding drawing.

Figures 6A, 6B:
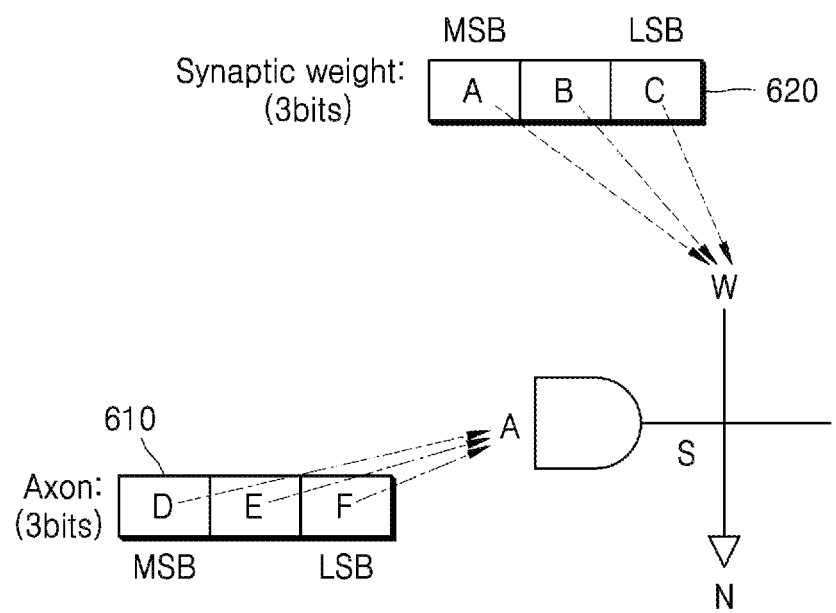
FIG. 6A is a diagram of an example describing a multi-bit neuromorphic operation performable by a neuromorphic apparatus.
FIG. 6B is a diagram of an example describing the mapping of operands respectively to an axon and a synaptic weight to perform a multi-bit neuromorphic operation (i.e., a multi-bit multiplication operation).

FIG. 6A is a diagram of an example describing a multi-bit neuromorphic operation performable by a neuromorphic apparatus.

Referring to FIG. 6A, as an example of the multi-bit neuromorphic operation, a multi-bit multiplication operation between 3-bit binary values is illustrated. The multi-bit multiplication operation denotes a multiplication operation in which at least one of operands includes a plurality of bits. When a first operand 611 of the multi-bit multiplication operation is $ABC_2$ that is a 3-bit binary value, and a second operand 612 is $DEF_2$ that is a 3-bit binary value, a multiplication operation of the first operand 611 and the second operand 612 may be performed by calculating intermediate products via bitwise multiplication, and then adding the calculated intermediate products according to the same bit positions.

For example, GHI that is a first intermediate product 613 is obtained by multiplying F that is LSB of $DEF_2$ of the second operand 612 and $ABC_2$ of the first operand 611. JKL of a second intermediate product 614 is obtained by multiplying E that is a second lower bit of $DEF_2$ and $ABC_2$. MNO that is a third intermediate product 615 is obtained by multiplying D that is a third lower bit (i.e., MSB) of $DEF_2$ and $ABC_2$ that is the first operand 611. Then, the first through third intermediate products 613 through 615 are added according to the same bit positions to obtain $PQRSTU_2$ that is a multi-bit multiplication operation result 616 between the first operand 611 and the second operand 612. Hereinafter, a method by which the neuromorphic processor 112 of FIG. 4 described above performs the multi-bit neuromorphic operation (i.e., the multi-bit multiplication operation) of FIG. 6A is described.

FIG. 6B is a diagram of an example describing mapping of operands respectively to an axon 610 and a synaptic weight 620 to perform a multi-bit neuromorphic operation (i.e., a multi-bit multiplication operation).

Referring to FIG. 6B, each bit value (A, B, and C) of $ABC_2$ that is the first operand 611 of FIG. 6A is mapped to the synaptic weight 620. MSB of the first operand 611 is mapped to MSB of the synaptic weight 620 and LSB of the first operand 611 is mapped to LSB of the synaptic weight 620.

In the same manner, each bit value (D, E, and F) of $DEF_2$ that is the second operand 612 of FIG. 6A is mapped to the axon 610. MSB of the second operand 612 is mapped to MSB of the axon 610 and LSB of the second operand 612 is mapped to LSB of the axon 610.

However, an embodiment is not limited to these examples, and unlike a mapping method described in FIG. 6B, the first operand 611 and the second operand 612 of FIG. 6A may be mapped to bit positions of the axon 610 and the synaptic weight 620 in a different mapping scheme. However, when other mapping methods are applied, the controller 1124 may determine combinations of i and j in a manner different from the above to correspond to mapped bit positions.

Figure 6C:
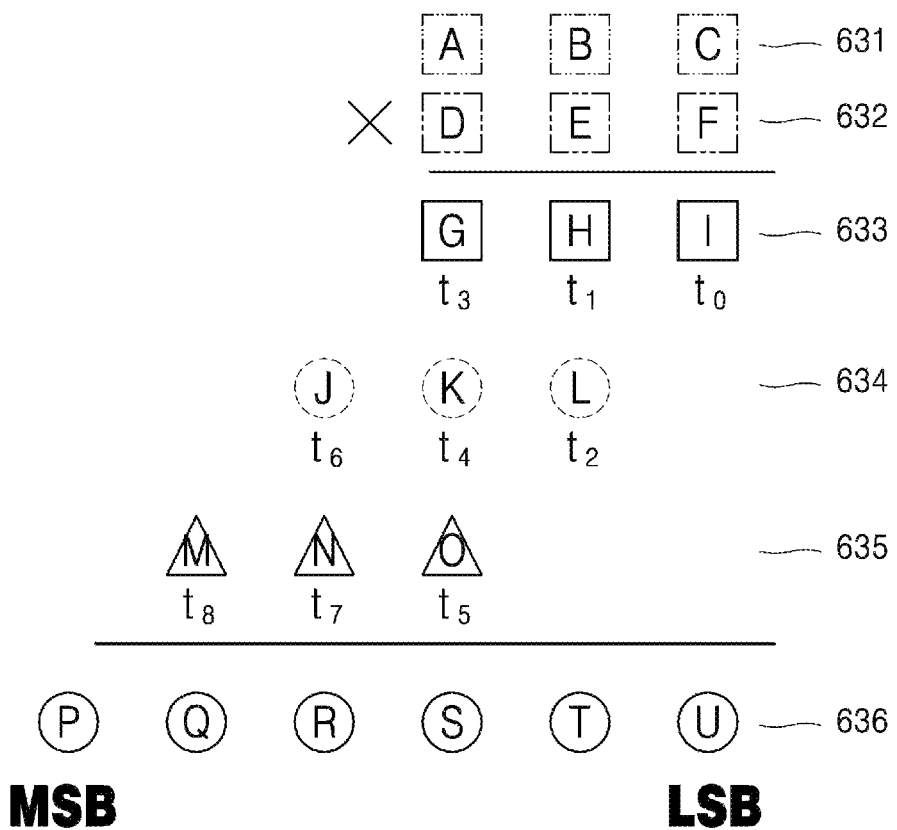
FIG. 6C is a diagram of an example describing a neuromorphic processor processing operands and intermediate products of a multi-bit neuromorphic operation (i.e., a multi-bit multiplication operation) in a time-division manner.

FIG. 6C is a diagram of an example describing the neuromorphic processor 112 processing operands and intermediate products of a multi-bit neuromorphic operation (i.e., a multi-bit multiplication operation) in a time-division manner.

Referring to FIG. 6C, as described with reference to FIG. 6B, each bit value (A, B, and C) of $ABC_2$ that is a first operand 631 is mapped to the synaptic weight 620 and each bit value (D, E, and F) of $DEF_2$ that is a second operand 632 is mapped to the axon 610.

Bit values of each of a first intermediate product GHI 633, a second intermediate product JKL 634, and a third intermediate product MNO 635, which are generated via multiplication of each bit value (A, B, and C) of the first operand $ABC_2$ 631 and each bit value (D, E, and F) of the second operand $DEF_2$ 632 in a time-division manner. For example, a bit value I of the first intermediate product GHI 633 may be obtained at a time $t_0$, a bit value H of the first intermediate product GHI 633 may be obtained at a time $t_1$, a bit value L of the second intermediate product JKL 634 may be obtained at a time $t_2$, so on, and a bit value M of the third intermediate product MNO 635 may be obtained at a time $t_8$.

The times $t_0$ through $t_8$ denote different times. For example, a time delayed by a pre-set time from the time $t_0$ may be the time $t_1$, a time delayed by a pre-set time from the time $t_1$ may be the time $t_2$; however, an embodiment is not necessarily limited to these examples. Also, throughout the specification, a time t is not for limiting a specific moment, but for distinguishing timing or a time section when related operations are performed. Accordingly, after an understanding of the disclosure, one would understand that operations described to be performed at a specific time point in the specification may not be necessarily simultaneously performed.

A result 636 of the multi-bit neuromorphic operation (i.e., multi-bit multiplication operation) of the first operand $ABC_2$ 631 and the second operand $DEF_2$ 632 is $PQRSTU_2$.

U corresponding to LSB in the result $PQRSTU_2$ 636 is obtained via I of the first intermediate product GHI 633. T in the result $PQRSTU_2$ 636 is obtained via the summation of H of the first intermediate product GHI 633 and L of the second intermediate product JKL 634. S in the result $PQRSTU_2$ 636 is obtained via the summation of G of the first intermediate product GHI 633, K of the second intermediate product JKL 634, O of the third intermediate product MNO 635, and a carry value obtained from a previous bit position. As such, the result $PQRSTU_2$ 636 may be sequentially obtained from U corresponding to LSB to P corresponding to MSB. In other words, the result $PQRSTU_2$ 636 may be obtained based on the summation of bit values of the first through third intermediate products 633 through 635 sequentially obtained from the time $t_0$ to time $t_8$.

Figure 6D:
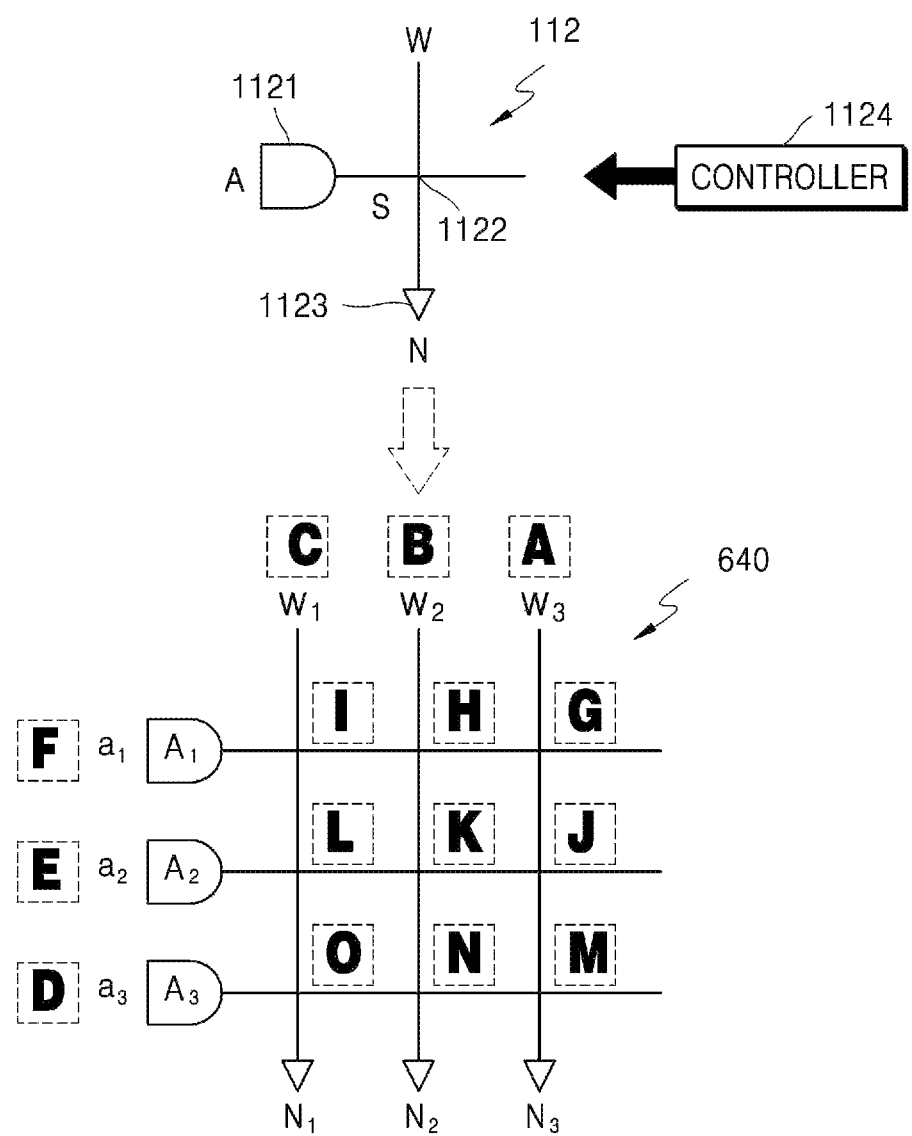
FIG. 6D is a diagram of an example describing virtual synapse array mapping for a neuromorphic processor to process a multi-bit neuromorphic operation in a time-division manner.

FIG. 6D is a diagram of an example describing virtual synapse array mapping for the neuromorphic processor 112 to process a multi-bit neuromorphic operation in a time-division manner.

Referring to FIG. 6D, as described above, the neuromorphic processor 112 includes the single axon circuit 1121, the single synaptic circuit 1122, the single neuron circuit 1123, and the controller 1124, but when the neuromorphic processor 112 operates in a time-division manner, the neuromorphic processor 112 may operate as if a 2D synapse array including at least one axon circuit, at least one synapse, and at least one neuron circuit. In the current embodiment, a 2D synapse array simulated to be processed by the neuromorphic processor 112 in the time-division manner is referred to as a virtual synapse array 640, but may alternately be referred to by another term. In other words, physical circuit configurations (for example, at least one axon circuit, at least one synapse, and at least one neuron circuit) of the virtual synapse array 640 may not actually be realized in the neuromorphic processor 112.

FIG. 6D illustrates the 3×3 virtual synapse array 640 which will be described in relation to the multi-bit neuromorphic operation (3-bit×3-bit multiplication operation) described above with reference to FIGS. 6A through 6C. However, alternatively, an array including various numbers of rows and columns may be used.

In the 3×3 virtual synapse array 640, the second operand $DEF_2$ 632 of FIG. 6C is mapped to axons $a_3$, $a_2$, and $a_1$, and the first operand $ABC_2$ 631 of FIG. 6C is mapped to synaptic weights $w_3$, $w_2$, and $w_1$. The bit value I of the first intermediate product GHI 633 of FIG. 6C may be obtained when a synapse operation between the axon (bit value $a_1$=F) and the synaptic weight (bit value $w_1$=C) is performed in a synapse provided as the axon $a_1$ and the synaptic weight $w_1$ cross each other. Similarly, bit values of the first through third intermediate products 633 through 635 may be mapped as shown in FIG. 6D when synapse operations are performed in synapses provided as the axons $a_3$, $a_2$, and $a_1$ and the synapse weights $w_3$, $w_2$, and $w_1$ cross each other in the 3×3 virtual synapse array 640.

The controller 1125 determines each of axons and synaptic weights to be provided to the single axon circuit 1121 and the single synaptic circuit 1122 such that mapping is performed in the above manner of the virtual synapse array 640.

Figure 7A:
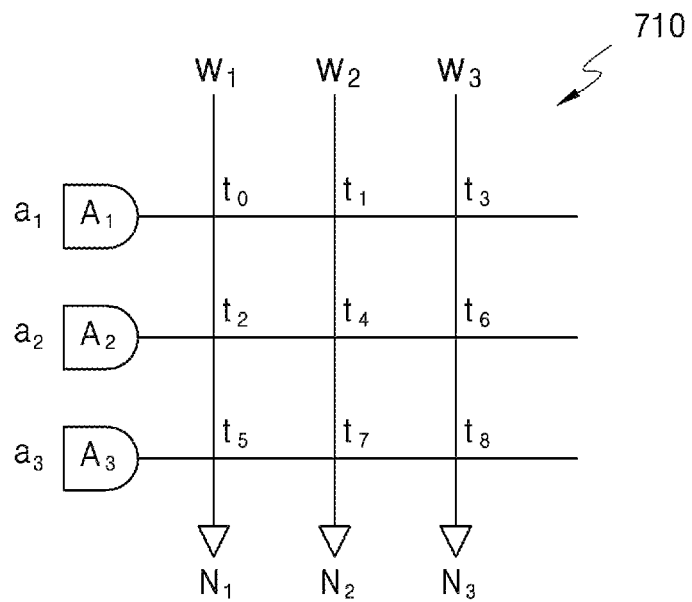
FIGS. 7A and 7B are diagrams of examples describing an order in which synaptic operations are to be performed by a neuromorphic processor in a time-division manner to process a multi-bit neuromorphic operation.
Figure 7B:
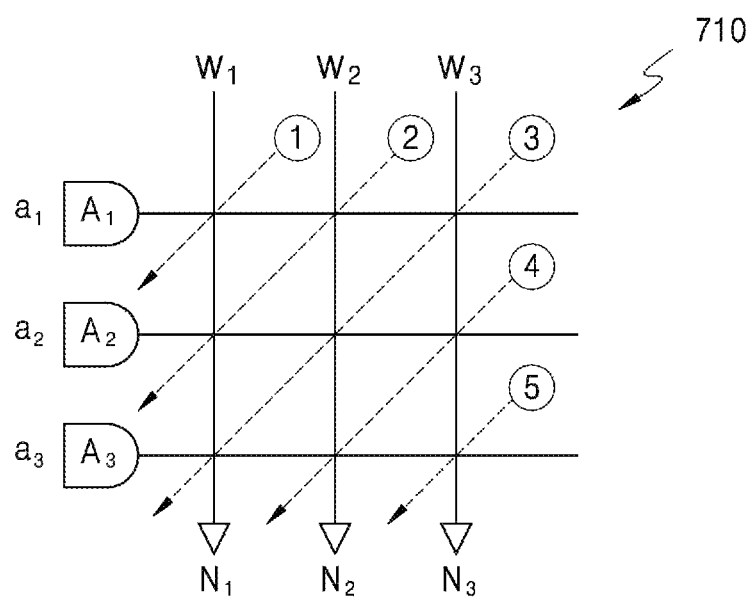

FIGS. 7A and 7B are diagrams of examples describing an order in which synaptic operations are to be performed by the neuromorphic processor 112 in a time-division manner to process a multi-bit neuromorphic operation.

Referring to FIG. 7A, synaptic operations between axons and synaptic weights are performed in synapses at crossing points between axons and synaptic weights of a virtual synapse array 710. The neuromorphic processor 112 may perform the synapse operations at the crossing points of the virtual synapse array 710 in the time-division manner.

According to the mapping method described above with reference to FIGS. 6A through 6D, the neuromorphic processor 112 provides the axon $a_1$ to the single axon circuit 1121 and the synaptic weight w to the single synaptic circuit 1122 at the time $t_0$, and obtains a synaptic operation value between the axon $a_1$ and the synaptic weight $w_1$. Then, the neuromorphic processor 112 provides the axon $a_1$ to the single axon circuit 1121 and the synaptic weight $w_2$ to the single synaptic circuit 1122 at the time $t_1$, and obtains a synaptic operation value between the axon $a_1$ and the synaptic weight w. In a similar manner, the neuromorphic processor 112 sequentially performs synapse operations up to the time $t_8$.

Referring to FIG. 7B, the order described in FIG. 7A is indicated by arrows. In this example, the synaptic operations from time $t_0$ to time $t_8$ are sequentially performed in an order corresponding to diagonal directions in the virtual synapse array 710.

Consequently, such an order is based on a method by which the controller 1124 changes and maps the values of i and j. The values of i and j are mapped from combinations where the summation of i and j is smallest to combinations where the summation of i and j is largest. Such combinations of the i-th lower bit and the j-th lower bit are sequentially assigned to each of the single axon circuit 1121 and the single synaptic circuit 1122 as described above.

Figure 7C:
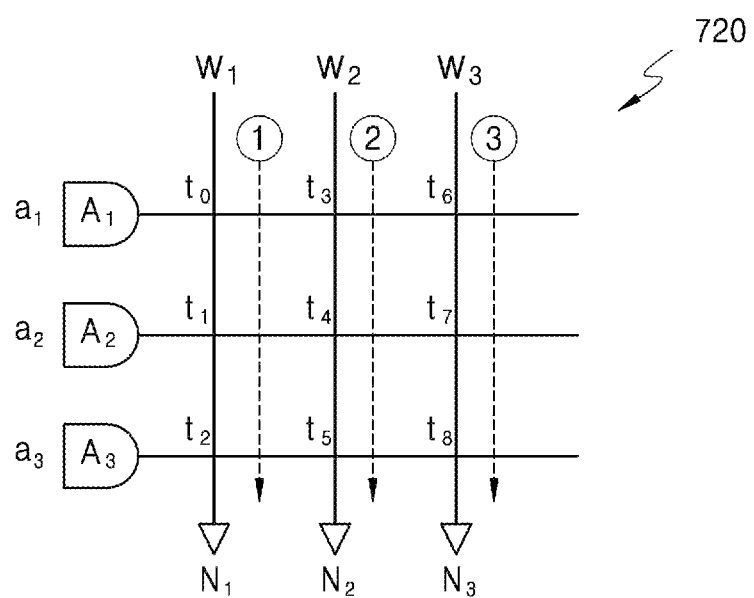
FIG. 7C is a diagram of an example describing an order in which a general neuromorphic processor performs synaptic operations.

FIG. 7C is a diagram for describing an order in which synaptic operations are performed by a general neuromorphic processor. Referring to FIG. 7C, the general neuromorphic processor is unable to perform a multi-bit neuromorphic operation, but is able to perform only a 1-bit neuromorphic operation (1-bit×1-bit multiplication operation). In other words, referring to a virtual synapse array 720, each of axons and each of synaptic weights do not correspond to some bit values of multi-bit operands, but correspond to 1-bit operands themselves. Also, the general neuromorphic processor performs synaptic operations in an order of a column direction shown in FIG. 7C, and thus a synaptic operation value obtained at the time to and a synaptic operation value obtained at the time $t_3$ are independent synaptic operation values irrelevant to each other.

On the other hand, according to the current example, the neuromorphic processor 112 assigns some bit values of multi-bit operands to axons and synaptic weights of the virtual synapse array 710 and performs synaptic operations in a time-division manner in an order of the diagonal direction of FIG. 7B, and thus a multi-bit neuromorphic operation is possible unlike the general neuromorphic processor.

FIGS. 8A through 8G are diagrams of examples describing processes of a neuromorphic processor performing a multi-bit neuromorphic operation in a time-division manner.

The processes of performing the multi-bit neuromorphic operation are described in FIGS. 8A through 8G by using the examples described above with reference to FIGS. 6A through 7B.

The single neuron circuit 1123 of the neuromorphic processor 112 of FIG. 4 obtains each bit value of a multi-bit neuromorphic operation result between an n-bit axon and an m-bit synaptic weight, based on a synaptic operation value output from the single synaptic circuit 1122 of FIG. 4. The single neuron circuit 1123 includes a single adder 810.

Figure 8A:
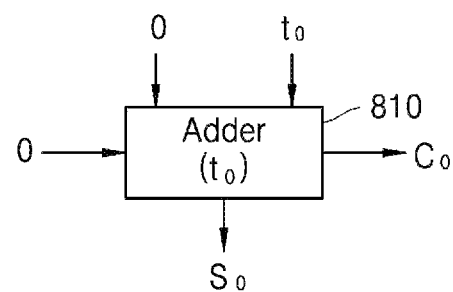
FIGS. 8A through 8G are diagrams of examples describing processes of a neuromorphic processor performing a multi-bit neuromorphic operation in a time-division manner.
Figure 8A:
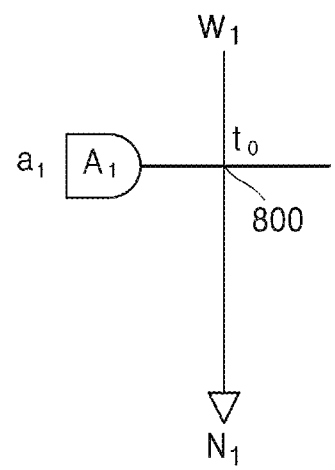

FIG. 8A illustrates processes at the time $t_0$.

The controller 1124 assigns the axon $a_1$ to the single neuron circuit 1123 and assigns the synaptic weight $w_1$ to the single synaptic circuit 1122 at the time $t_0$.

A synapse 800 stores the synaptic weight $w_1$. After the synaptic weight $w_1$ is stored, the synapse 800 performs the synapse operation between the axon $a_1$ and the synaptic weight $w_1$ to obtain the synapse operation value corresponding to the time $t_0$.

The single adder 810 receives a pre-set initial value 0 as an augend, receives the synaptic operation value corresponding to the time $t_0$ as an addend, and receives the pre-set initial value 0 as a previous carry value. Upon receiving all inputs, the single adder 810 performs an addition operation to output an addition value $S_0$ and a carry value $C_0$. The addition value $S_0$ corresponds to LSB among bits indicating a result of a multi-bit neuromorphic operation (multi-bit multiplication operation). Also, the carry value $C_0$ is input as a previous carry value of an addition operation to be performed next.

Figure 8B:
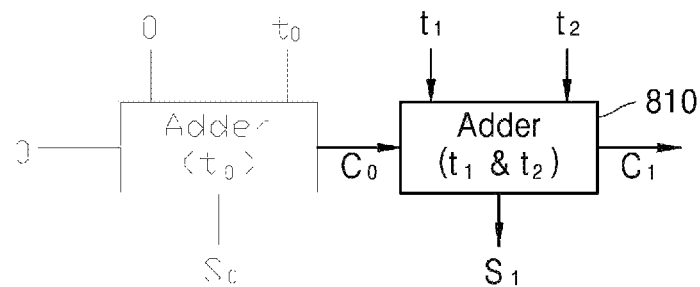
Figure 8B:
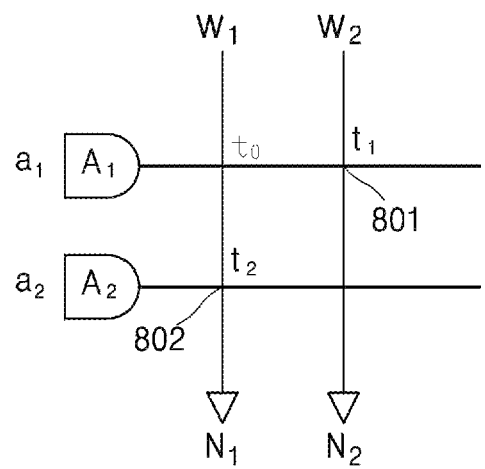

FIG. 8B illustrates processes at times $t_1$ and $t_2$.

The controller 1124 assigns the axon $a_1$ to the single neuron circuit 1123 and assigns the synaptic weight $w_2$ to the single synaptic circuit 1122 at the time $t_1$. When the synaptic weight $w_2$ is stored, a synapse 801 performs the synapse operation between the axon $a_1$ and the synaptic weight $w_2$ to obtain the synaptic operation value corresponding to the time $t_1$. The single adder 810 receives the carry value $C_0$ and the synaptic operation value corresponding to the time $t_1$.

The controller 1124 assigns the axon $a_2$ to the single neuron circuit 1123 and assigns the synaptic weight $w_1$ to the single synaptic circuit 1122 at the time $t_2$. When the synaptic weight $w_1$ is stored, a synapse 802 performs the synapse operation between the axon $a_2$ and the synaptic weight $w_1$ to obtain the synaptic operation value corresponding to the time $t_2$.

Upon receiving all inputs of the carry value $C_0$, the synaptic operation value corresponding to the time $t_1$, and the synaptic operation value corresponding to the time $t_2$, the single adder 810 outputs an addition value $S_1$ and a carry value $C_1$ by performing an addition operation. The addition value $S_1$ corresponds to a bit value of a second lower bit among the bits indicating the result of the multi-bit neuromorphic operation (multi-bit multiplication operation. Also, the carry value $C_1$ is input as a previous carry value of an addition operation to be performed next.

Figure 8C:
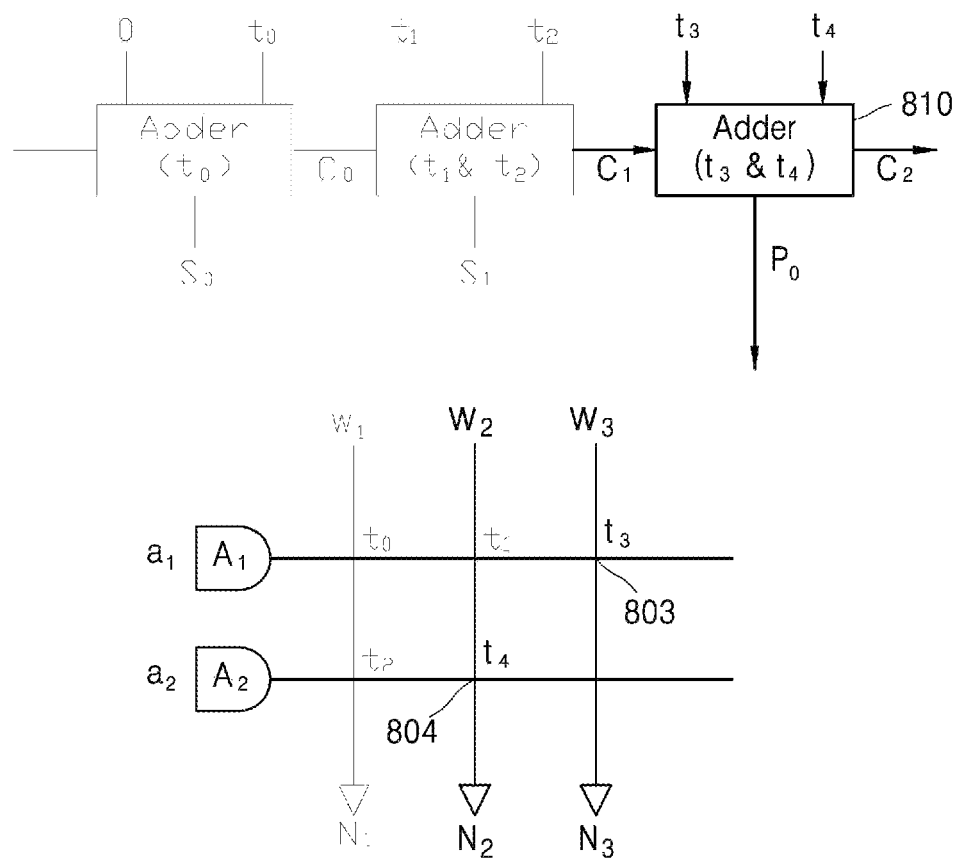

FIG. 8C illustrates processes at times $t_3$ and $t_4$.

The controller 1124 assigns the axon $a_1$ to the single neuron circuit 1123 and assigns the synaptic weight $w_3$ to the single synaptic circuit 1122 at the time $t_3$. A synapse 803 obtains a synaptic operation value corresponding to the time t3 and the single adder 810 receives the carry value $C_1$ and the synaptic operation value corresponding to the time $t_3$.

The controller 1124 assigns the axon $a_2$ to the single neuron circuit 1123 and assigns the synaptic weight $w_2$ to the single synaptic circuit 1122 at the time $t_4$. A synapse 804 obtains a synaptic operation value corresponding to the time $t_4$.

Upon receiving all inputs of the carry value $C_1$, the synaptic operation value corresponding to the time $t_3$, and the synaptic operation value corresponding to the time $t_4$, the single adder 810 outputs an addition value $P_0$ and a carry value $C_2$ by performing an addition operation. The addition value $P_0$ is used as an input for performing a next addition operation at the time $t_5$. Also, the carry value $C_2$ is input as a previous carry value of the addition operation to be performed next.

Figure 8D:
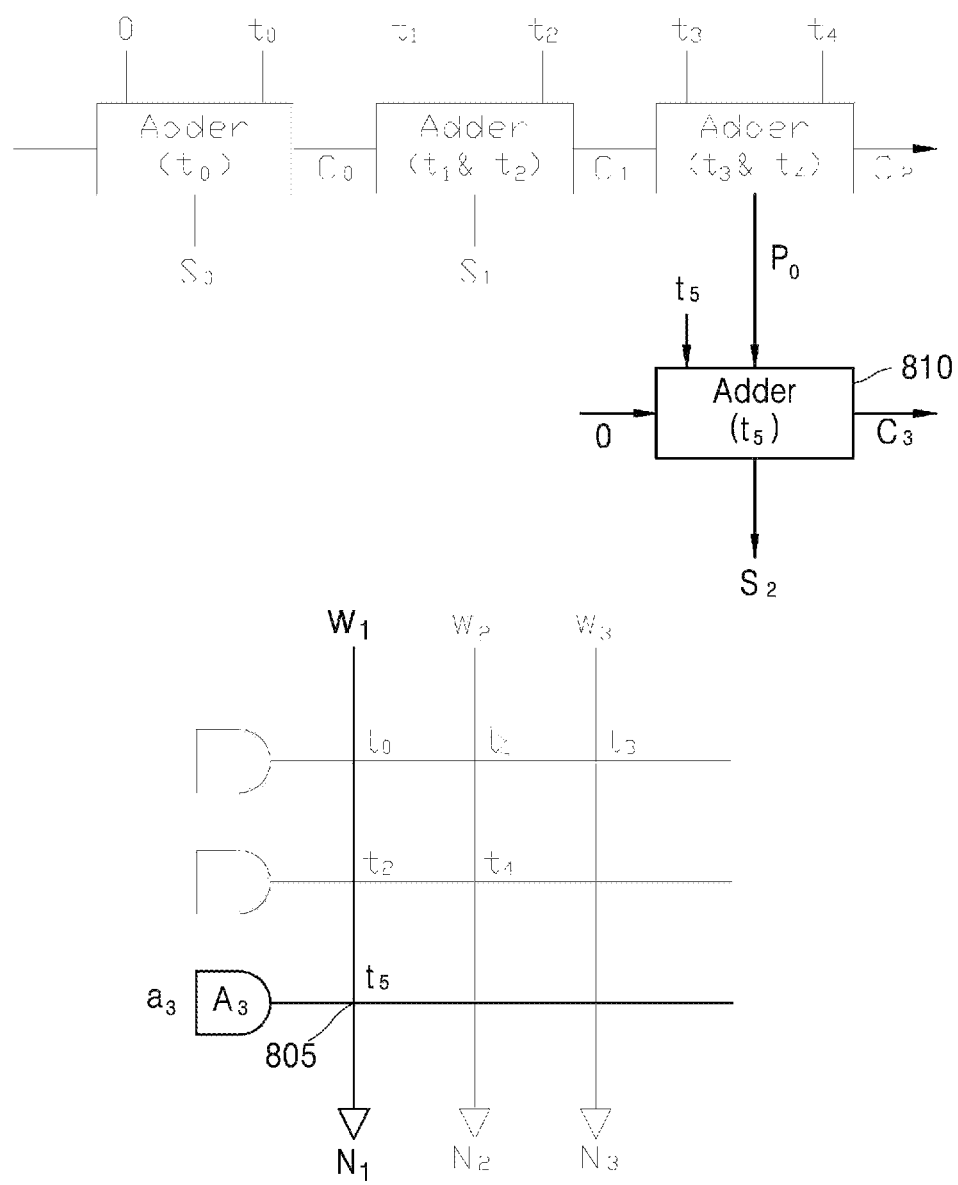

FIG. 8D illustrates processes at the time $t_5$.

The controller 1124 assigns the axon $a_3$ to the single neuron circuit 1123 and assigns the synaptic weight $w_1$ to the single synaptic circuit 1122 at the time $t_5$. A synapse 805 obtains a synaptic operation value corresponding to the time $t_5$.

Upon receiving all inputs of the synaptic operation value corresponding to the time $t_5$, the addition value $P_0$ obtained previously, and a pre-set carry value 0, the single adder 810 outputs an addition value $S_2$ and a carry value $C_3$ by performing an addition operation. The addition value $S_2$ corresponds to a bit value of a third lower bit among the bits indicating the result of the multi-bit neuromorphic operation (multi-bit multiplication operation). Also, the carry value $C_3$ is input as a previous carry value of the addition operation to be performed next.

Figure 8E:
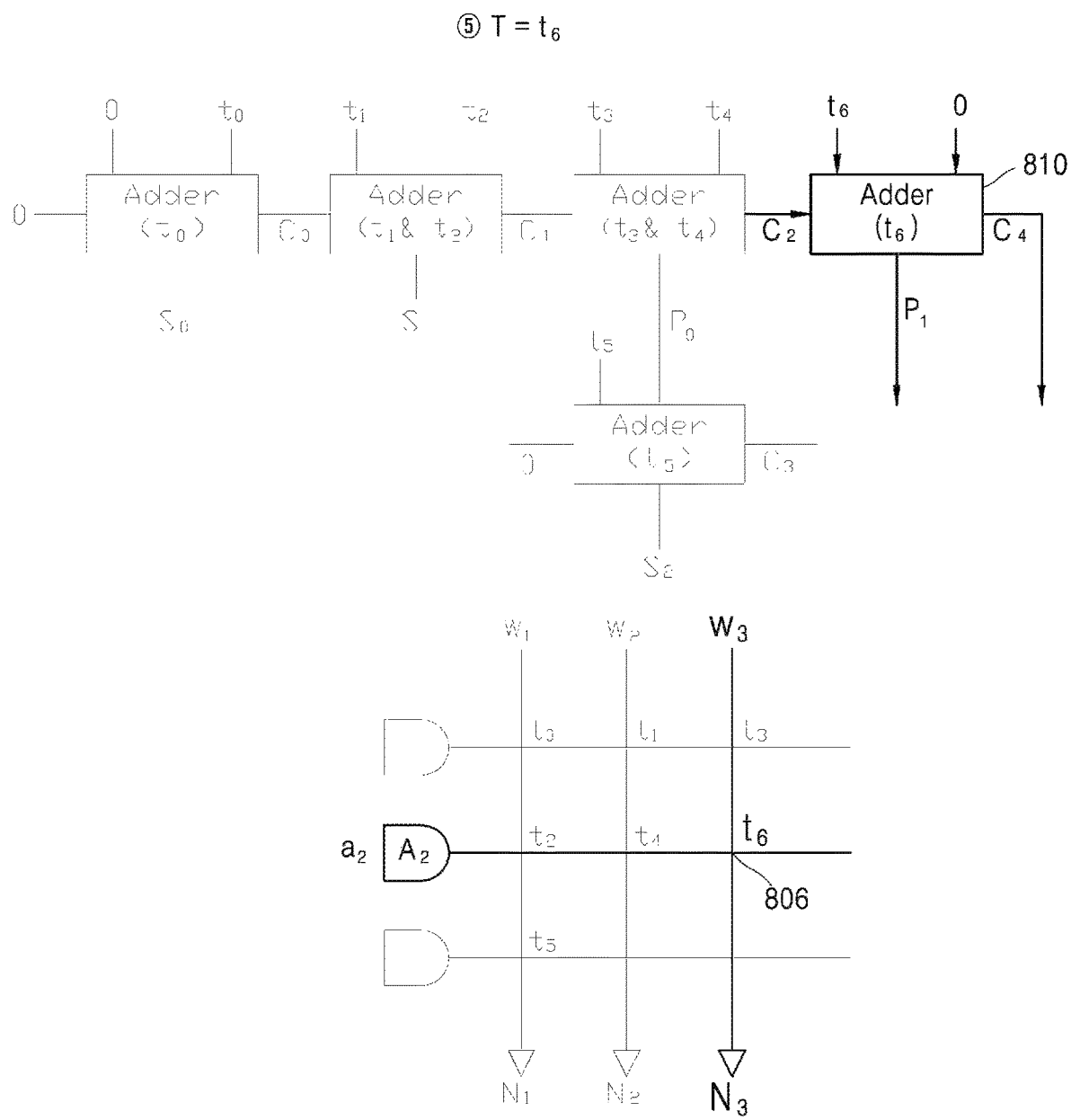

FIG. 8E illustrates processes at the time $t_6$.

The controller 1124 assigns the axon $a_2$ to the single neuron circuit 1123 and assigns the synaptic weight w3 to the single synaptic circuit 1122 at the time $t_6$. A synapse 806 obtains a synaptic operation value corresponding to the time $t_6$.

Upon receiving all inputs of the synaptic operation value corresponding to the time $t_6$, the pre-set initial value 0, and the carry value $C_2$, the single adder 810 outputs an addition value $P_1$ and a carry value $C_4$ by performing an addition operation. The addition value $P_1$ is used as an input for the single adder 810 to perform a next addition operation at the time $t_7$. Also, the carry value $C_4$ is input as a previous carry value of the addition operation to be performed next.

Figure 8F:
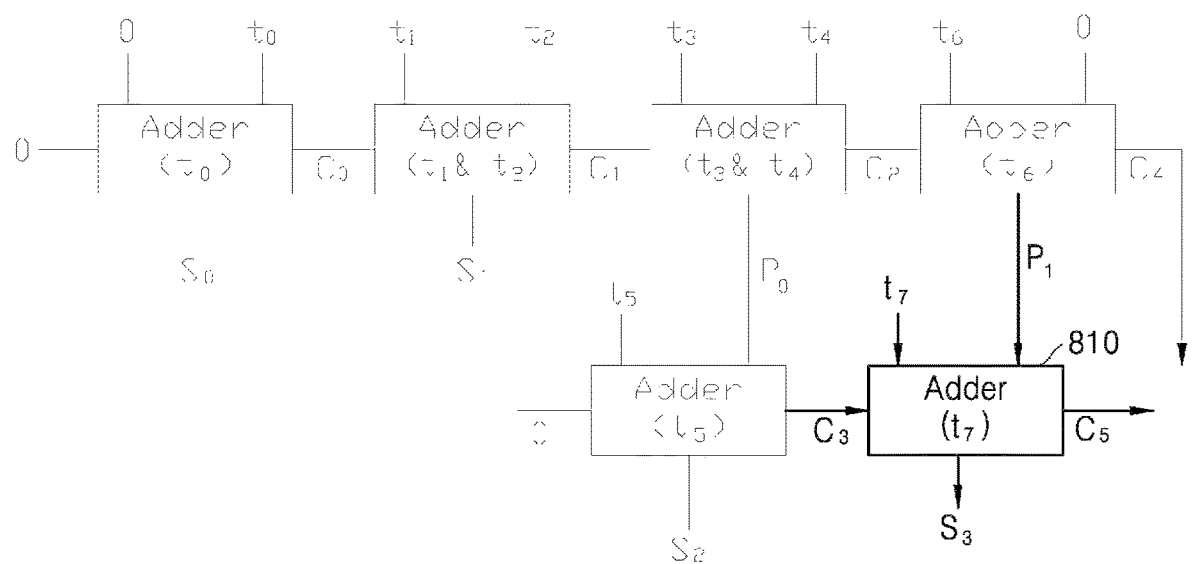
Figure 8F:
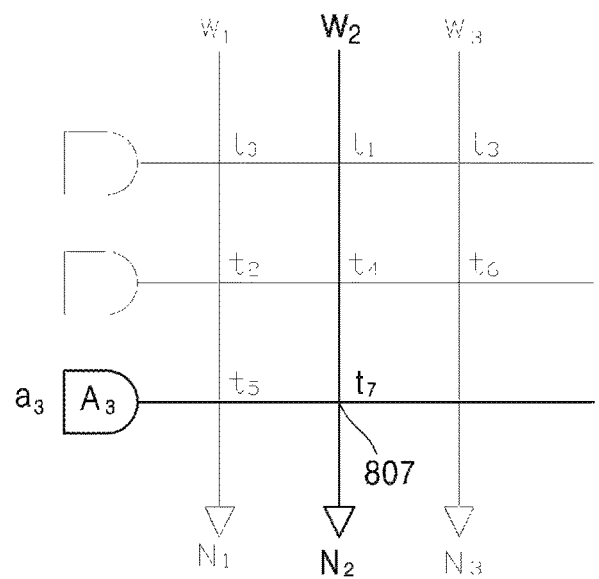

FIG. 8F illustrates processes at the time $t_7$.

The controller 1124 assigns the axon $a_3$ to the single neuron circuit 1123 and assigns the synaptic weight $w_2$ to the single synaptic circuit 1122 at the time $t_7$. A synapse 807 obtains a synaptic operation value corresponding to the time $t_7$.

Upon receiving all inputs of the synaptic operation value corresponding to the time $t_7$, the addition value $P_1$ obtained previously, and the carry value $C_3$, the single adder 810 outputs an addition value $S_3$ and a carry value $C_5$ by performing an addition operation. The addition value $S_3$ corresponds to a bit value of a fourth lower bit among the bits indicating the result of the multi-bit neuromorphic operation (multi-bit multiplication operation). Also, the carry value $C_5$ is input as a previous carry value of the addition operation to be performed next.

Figure 8G:
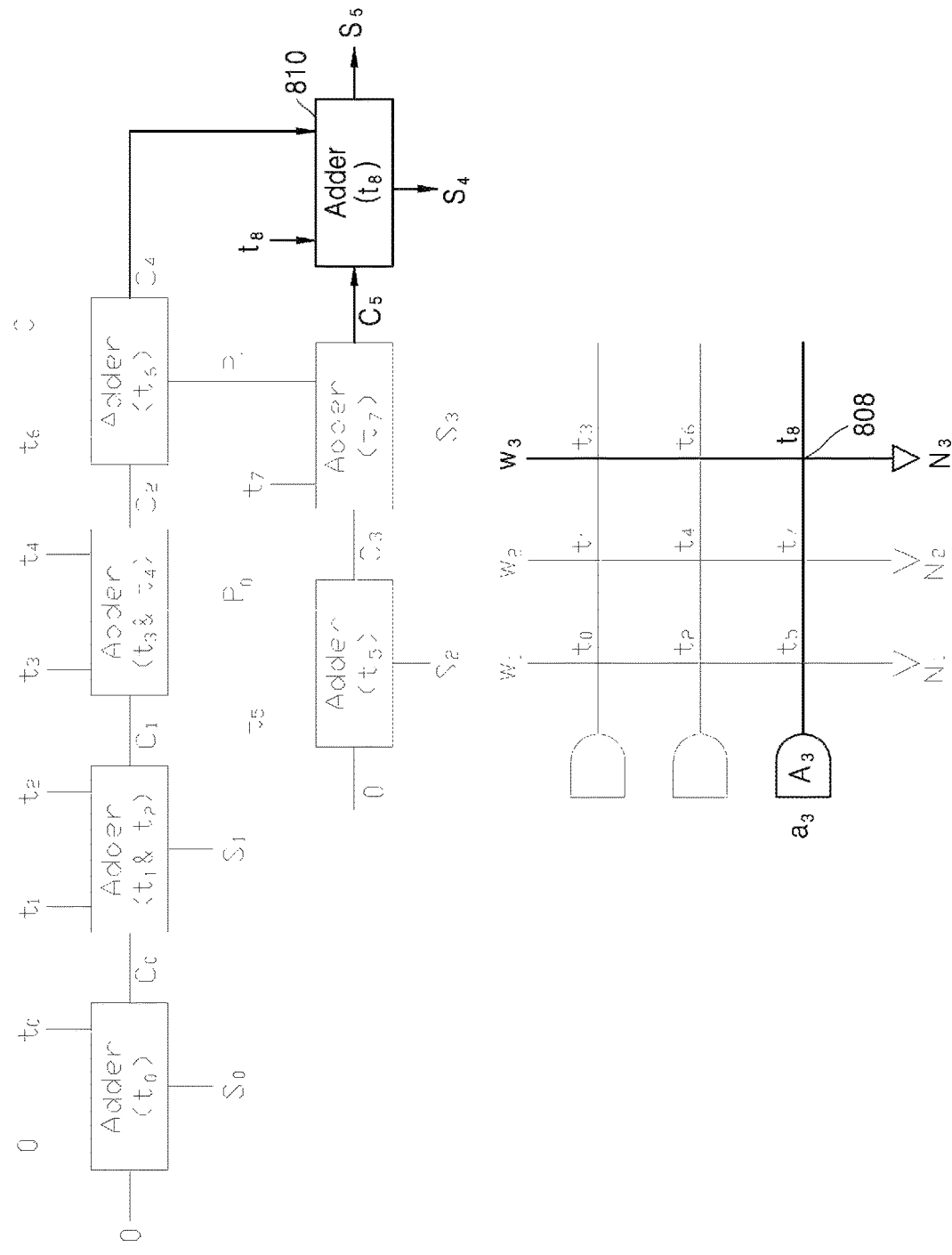

FIG. 8G illustrates processes at the time $t_8$.

The controller 1124 assigns the axon $a_3$ to the single neuron circuit 1123 and assigns the synaptic weight $w_3$ to the single synaptic circuit 1122 at the time $t_8$. A synapse 808 obtains a synaptic operation value corresponding to the time $t_8$.

Upon receiving all inputs of the synaptic operation value corresponding to the time $t_8$, the carry value $C_4$, and the carry value $C_5$, the single adder 810 outputs an addition value $S_4$ and a carry value $S_5$ by performing an addition operation. The addition value $S_4$ and the carry value $S_5$ respectively correspond to bit values of fifth and sixth lower bits among the bits indicating the result of the multi-bit neuromorphic operation (multi-bit multiplication operation).

As described above, the single adder 810 included in the single neuron circuit 1123 is reused at each time point to perform the addition operation. In other words, the single adder 810 may perform the addition operation when all inputs are received, and store previous addition operation results (for example, an addition value, a carry value, etc.) in a memory (a buffer, a register, or the like) connected to the single adder 810 to perform a next addition operation. The previous addition operation results stored in the memory may be reset and reused before a next addition operation is performed. In other words, since the neuromorphic processor 112 according to the current embodiment performs the multi-bit multiplication operation by reusing the single adder 810, a circuit area for realizing the neuromorphic processor 112 may be reduced.

Figure 9:
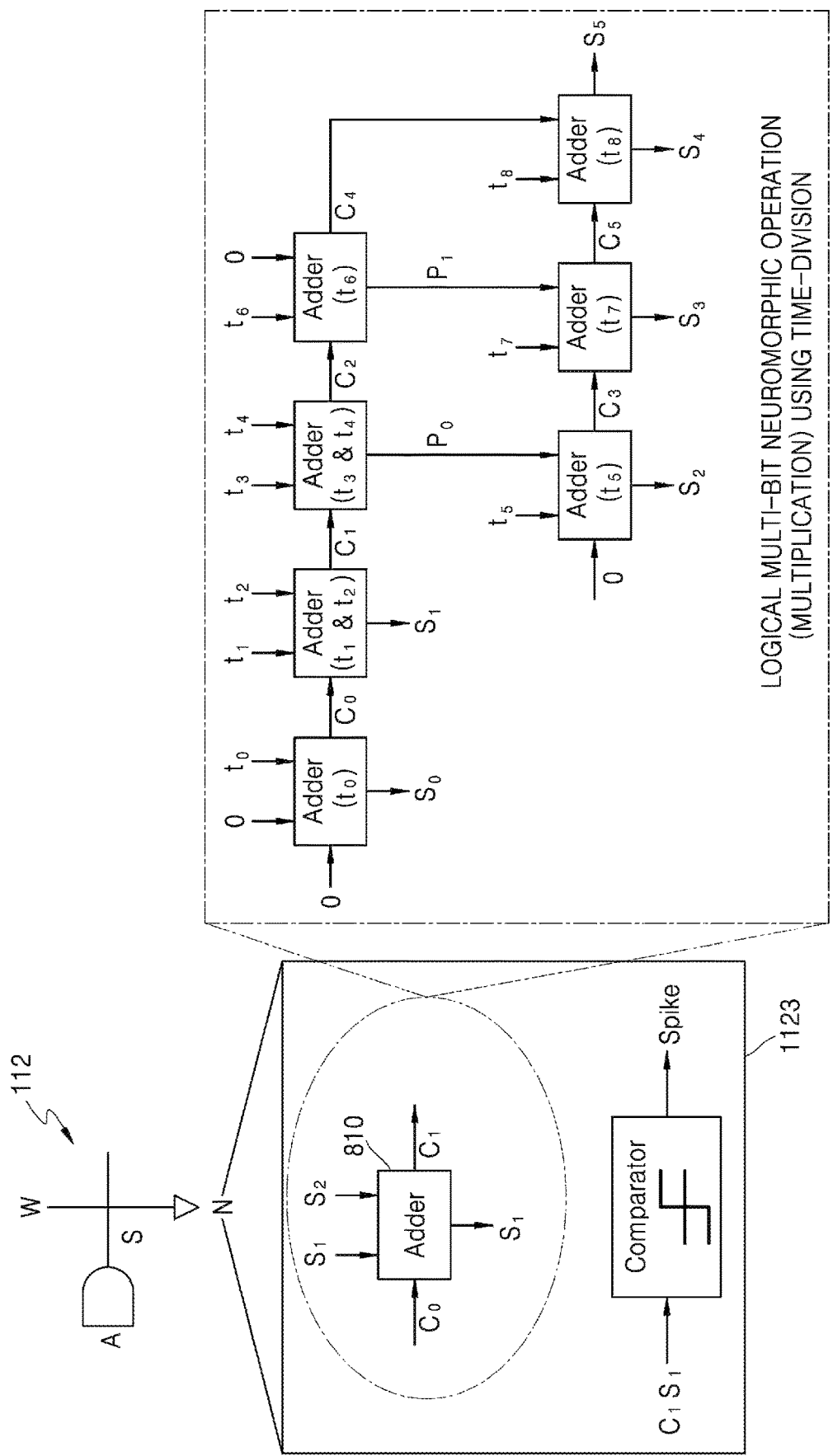
FIG. 9 is a diagram of an example summarizing and describing the processes of FIGS. 8A through 8G.

FIG. 9 is a diagram of an example summarizing and describing the processes of FIGS. 8A through 8G.

As described above, the controller 1124 of the neuromorphic processor 112 determines, so as to obtain the multi-bit neuromorphic operation result sequentially from a lower bit value to an upper bit value, the first input of the i-th lower bit of the axon 510 to be assigned to the single axon circuit 1121 at each time point (for example, from the time $t_0$ to the time $t_8$) and the second input of the j-th lower bit of the synaptic weight 520 to be assigned to the single synaptic circuit 1122 at each time point (for example, from the time $t_0$ to the time $t_8$). When the second input is stored in the single synaptic circuit 1122, the single synaptic circuit 1122 outputs the synaptic operation value between the first input and the second input. The single neuron circuit 1123 obtains the bit values $S_5$, $S_4$, $S_3$, $S_2$, $S_1$, and $S_0$ of the multi-bit neuromorphic operation result between the axon 510 and the synaptic weight 520, based on the synaptic operation result output from the single synaptic circuit 1122. In other words, the neuromorphic processor 112 may perform a multi-bit multiplication operation of multi-bit operands by adjusting an operation order and an operation time.

Meanwhile, the bit values $S_5$, $S_4$, $S_3$, $S_2$, $S_1$, and $S_0$ of the multi-bit neuromorphic operation result correspond to bit values of the multi-bit neuromorphic operation result PQRSTU$_2$ of FIGS. 7A through 7B. Also, the synaptic operation value corresponding to each of the times t$_0$ through t$_8$ described with reference to FIGS. 8A through 9 correspond to each bit value of the first through third intermediate products 633 through 635 described with reference to FIG. 6C.

FIGS. 10A through 10E are diagrams of examples describing results of processing a 3-bit×3-bit multiplication operation by the neuromorphic processor 112.

Figure 10A:
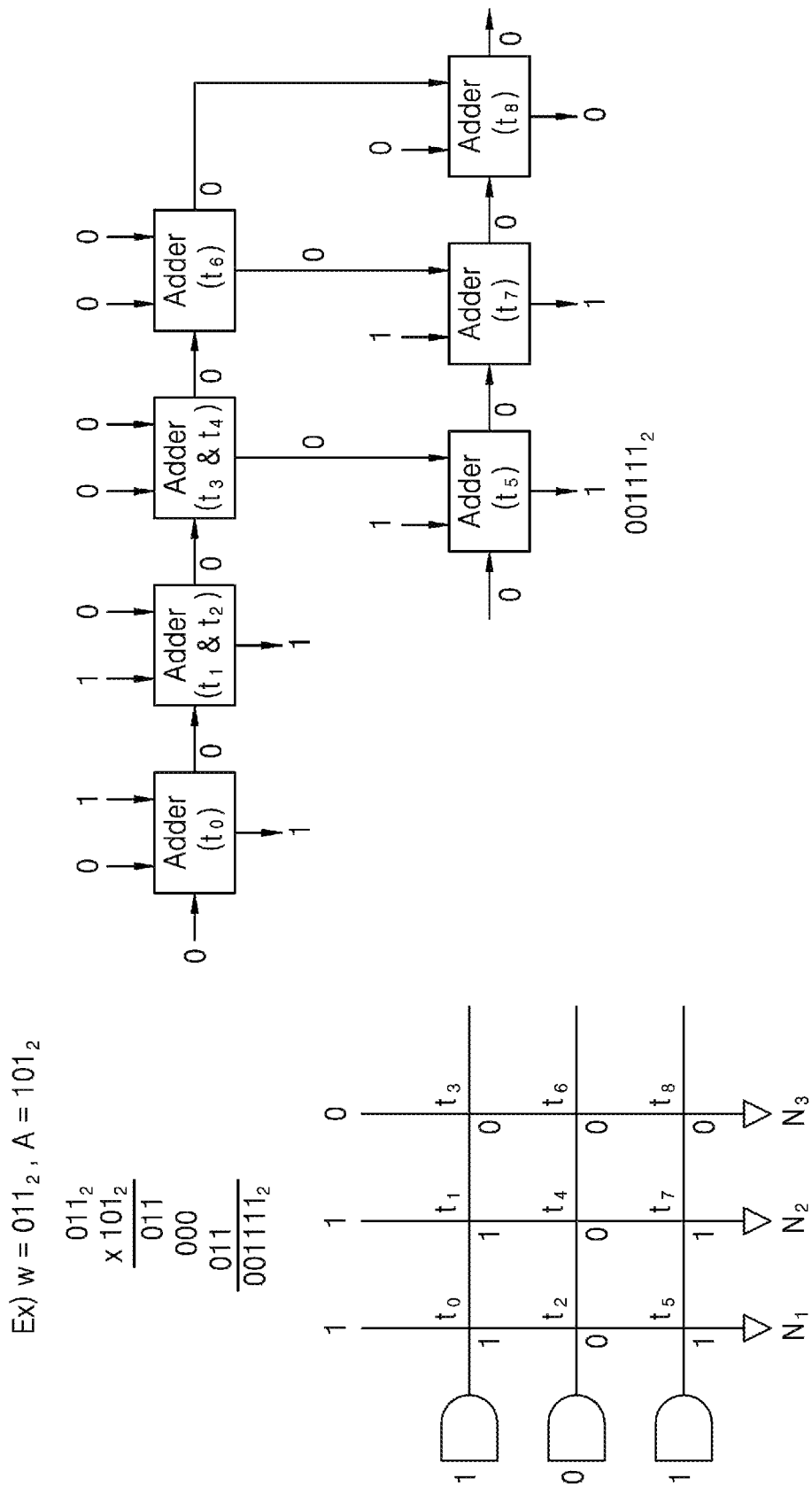
FIGS. 10A through 10E are diagrams of examples describing results of processing of a 3-bit×3-bit multiplication operation by a neuromorphic processor.
Figure 10B:
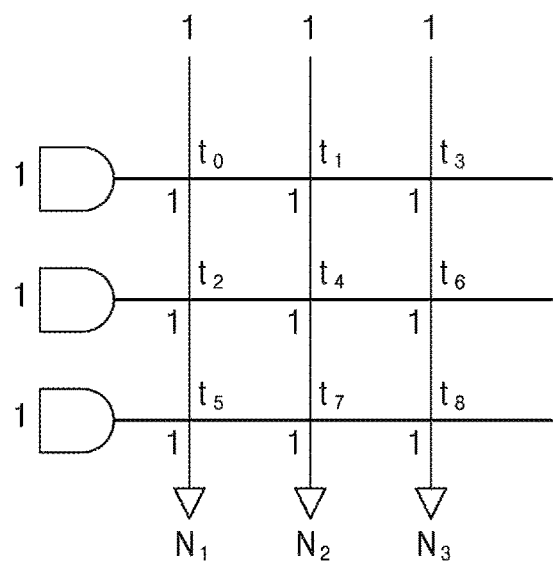
Figure 10B:
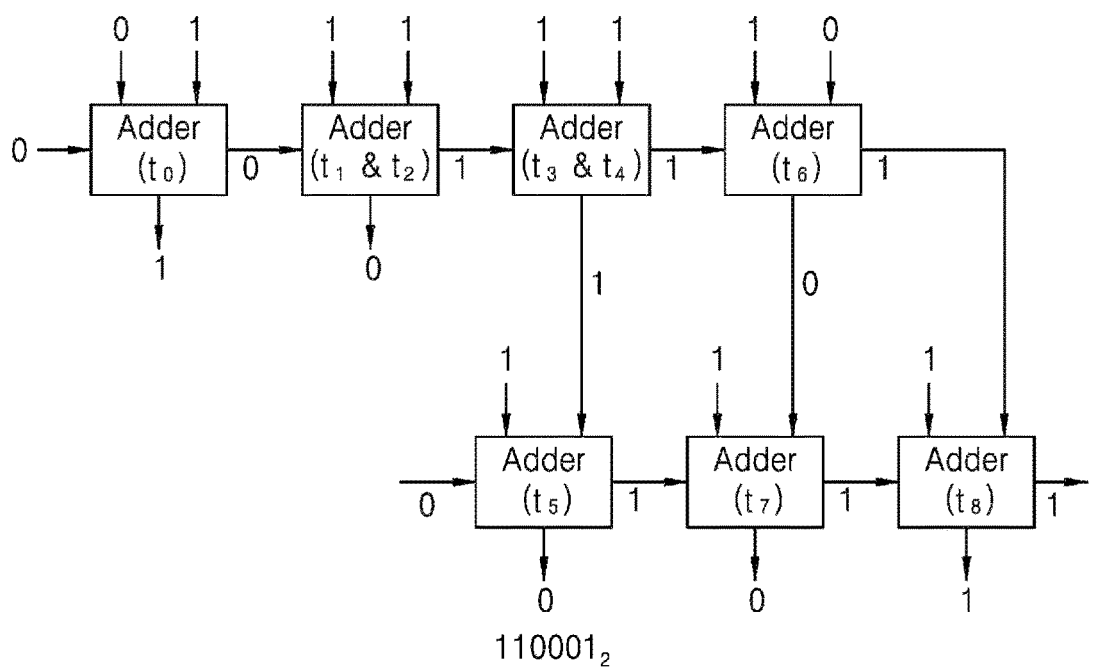
Figure 10C:
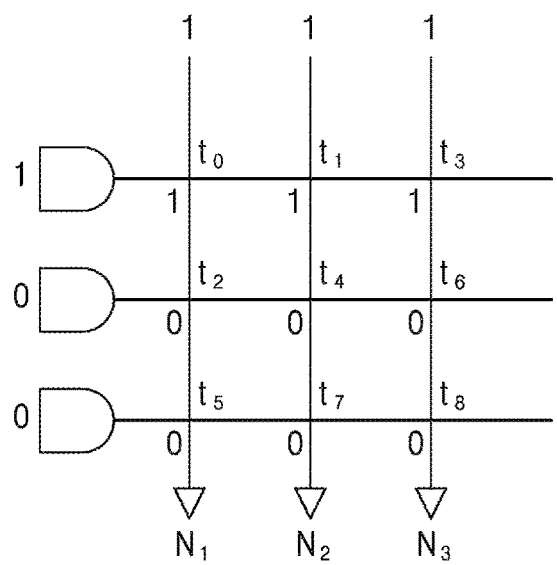
Figure 10C:
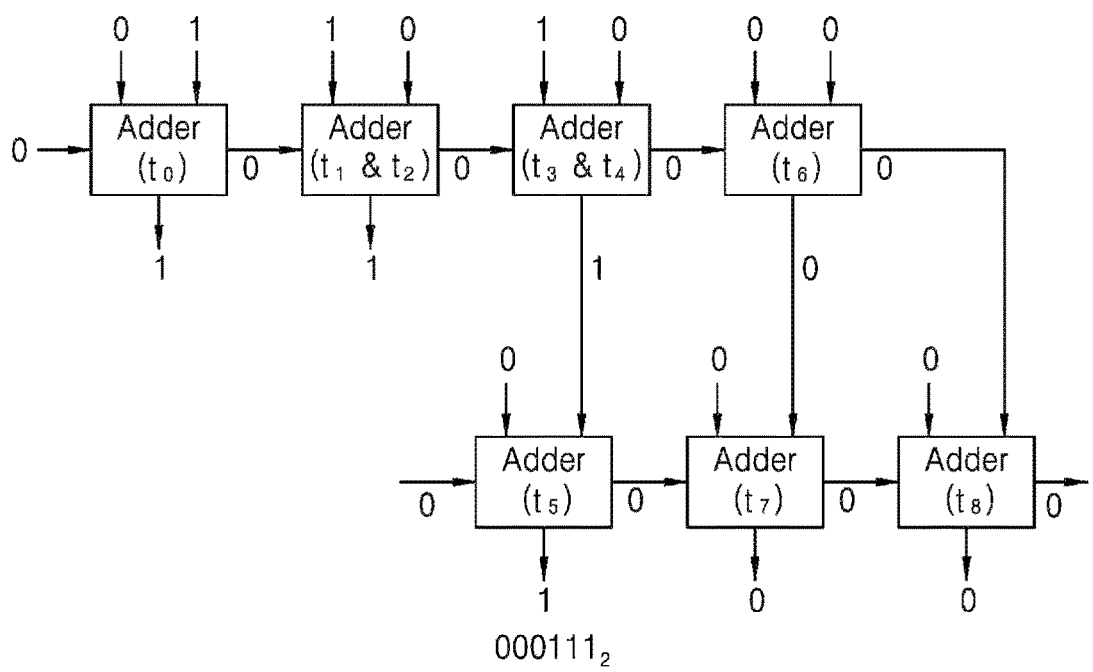
Figure 10D:
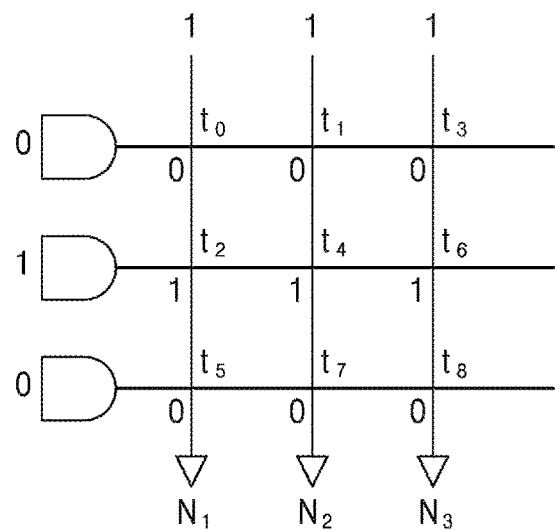
Figure 10D:
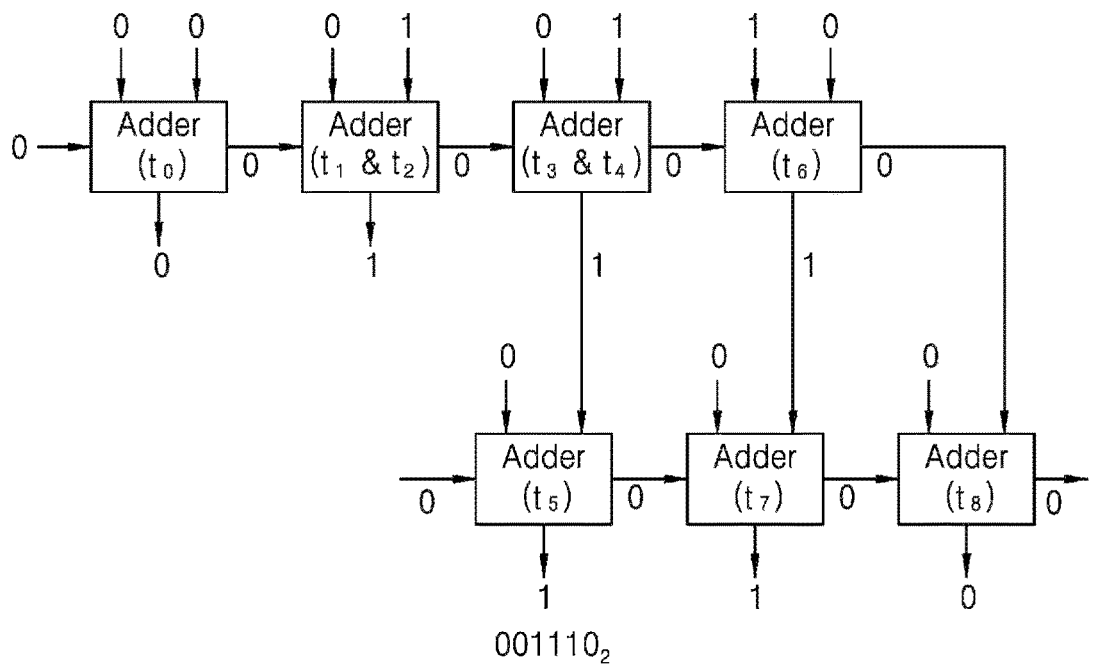
Figure 10E:
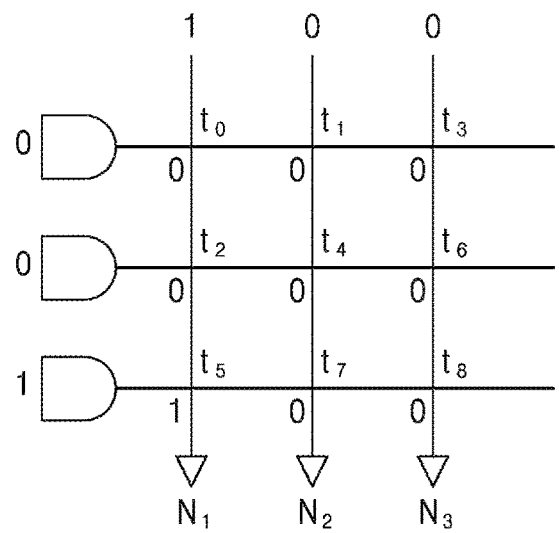
Figure 10E:
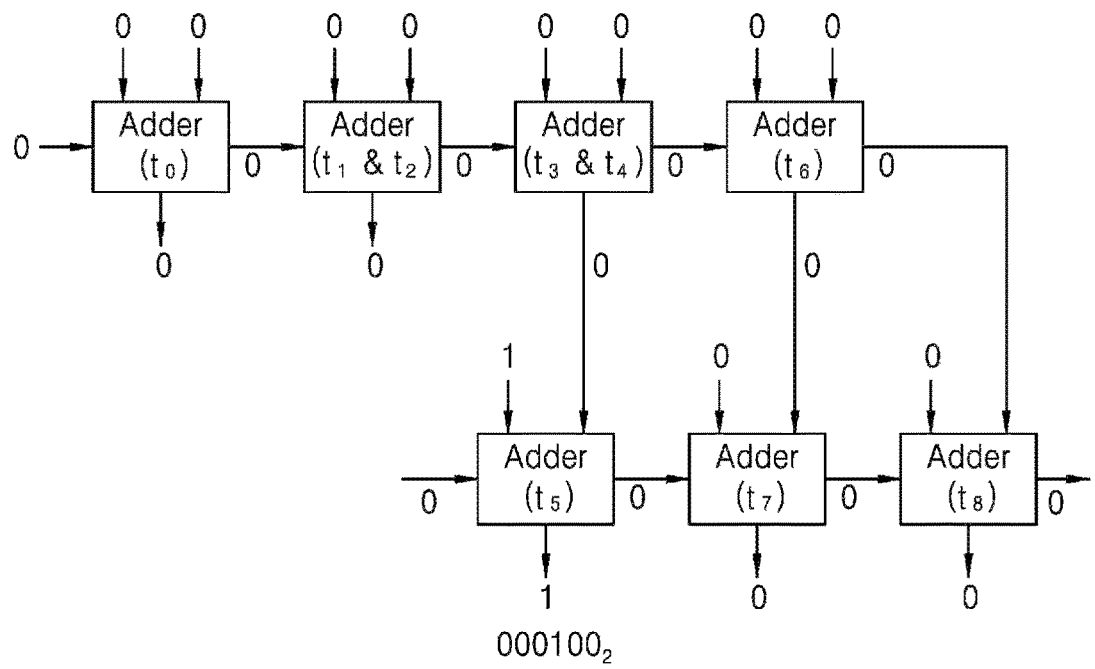

Referring to FIG. 10A, a 6-bit multiplication result of 001111$_2$ may be obtained when a multi-bit multiplication operation of a 3-bit synaptic weight 0112 and a 3-bit axon 101$_2$ is performed as described above. Referring to FIG. 10B, a 6-bit multiplication result of 110001$_2$ may be obtained when a multi-bit multiplication operation of a 3-bit synaptic weight 111$_2$ and a 3-bit axon 111$_2$ is performed as described above. Referring to FIG. 10O, a 6-bit multiplication result of 000111$_2$ may be obtained when a multi-bit multiplication operation of a 3-bit synaptic weight 111$_2$ and a 3-bit axon 001$_2$ is performed as described above. Referring to FIG. 10D, a 6-bit multiplication result of 001110$_2$ may be obtained when a multi-bit multiplication operation of a 3-bit synaptic weight 111$_2$ and a 3-bit axon 0102 is performed as described above. Referring to FIG. 10E, a 6-bit multiplication result of 000100$_2$ may be obtained when a multi-bit multiplication operation of a 3-bit synaptic weight 001$_2$ and a 3-bit axon 100$_2$ is performed as described above.

In other words, the neuromorphic processor 112 may perform a multi-bit neuromorphic operation (multi-bit multiplication operation) according to time-division processes and distribution of bit values of axon and synaptic weight described above.

Figure 11:
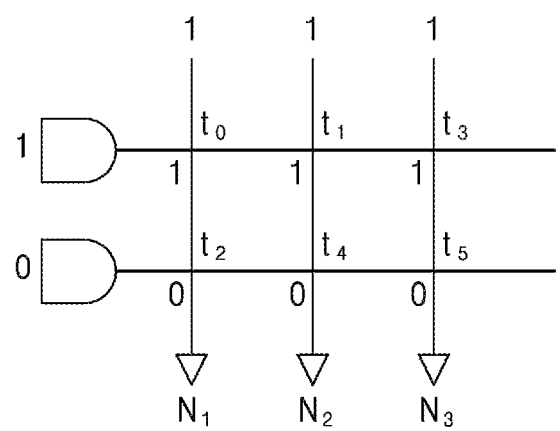
FIG. 11 is a diagram of an example describing results of processing of a 3-bit×2-bit multiplication operation by a neuromorphic processor.
Figure 11:
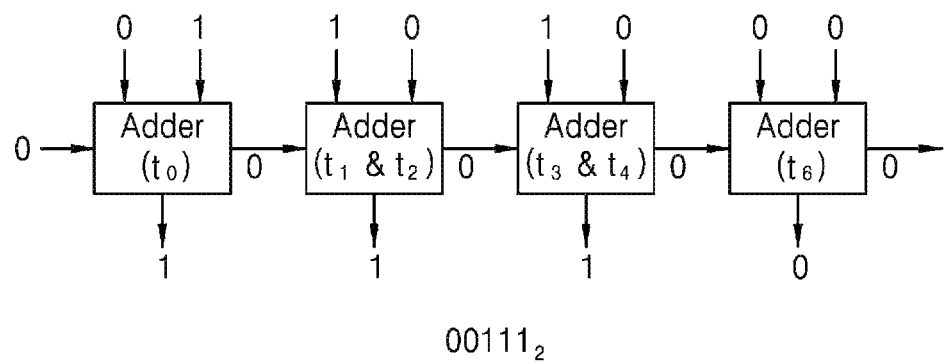

FIG. 11 is a diagram of an example describing results of processing a 3-bit×2-bit multiplication operation by the neuromorphic processor 112. Hereinafter, for the convenience of description, a 3-bit×3-bit multiplication operation is described as an example of the multi-bit neuromorphic operation. However, example exist with the neuromorphic processor 112 performing a multiplication operation of other various bits according to time-division processes and distribution of bit values of axon and synaptic weight described above.

Referring to FIG. 11, a 5-bit multiplication result of 00111$_2$ may be obtained when a multi-bit multiplication operation of a 3-bit synaptic weight 111$_2$ and a 2-bit axon 01$_2$ is performed as described above.

Figure 12:
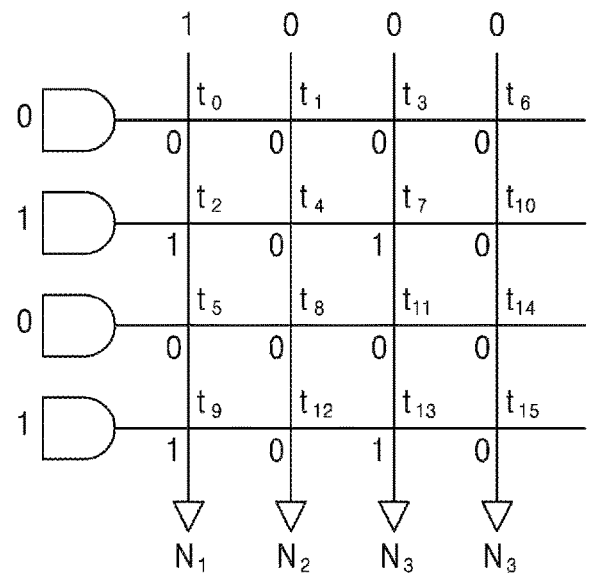
FIG. 12 is a diagram of an example describing results of processing of a 4-bit×4-bit multiplication operation by a neuromorphic processor.
Figure 12:
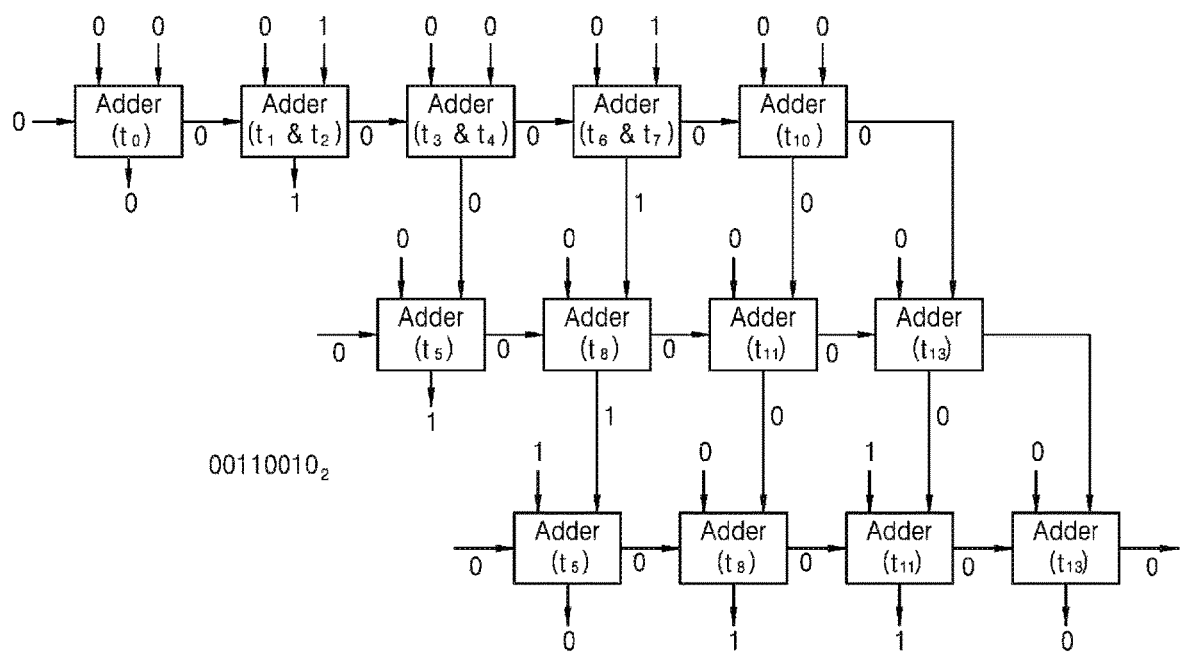

FIG. 12 is a diagram of an example describing results of processing a 4-bit×4-bit multiplication operation by the neuromorphic processor 112. Referring to FIG. 12, an 8-bit multiplication result of 00110010$_2$ may be obtained when a multi-bit multiplication operation of a 4-bit synaptic weight 0101$_2$와 and a 4-bit axon 1010$_2$ is performed as described above.

Meanwhile, in a neural network, operation precision may vary according to layers and also according to processor cores that process the neural network in parallel. Here, the neuromorphic processor 112 according to the current embodiment may process data of various operation precisions required to execute the neural network without having to change the hardware component by performing distribution of bit values of an axon and synaptic weight based on the respective operation precision and scheduling of time-division processes.

Figure 13:
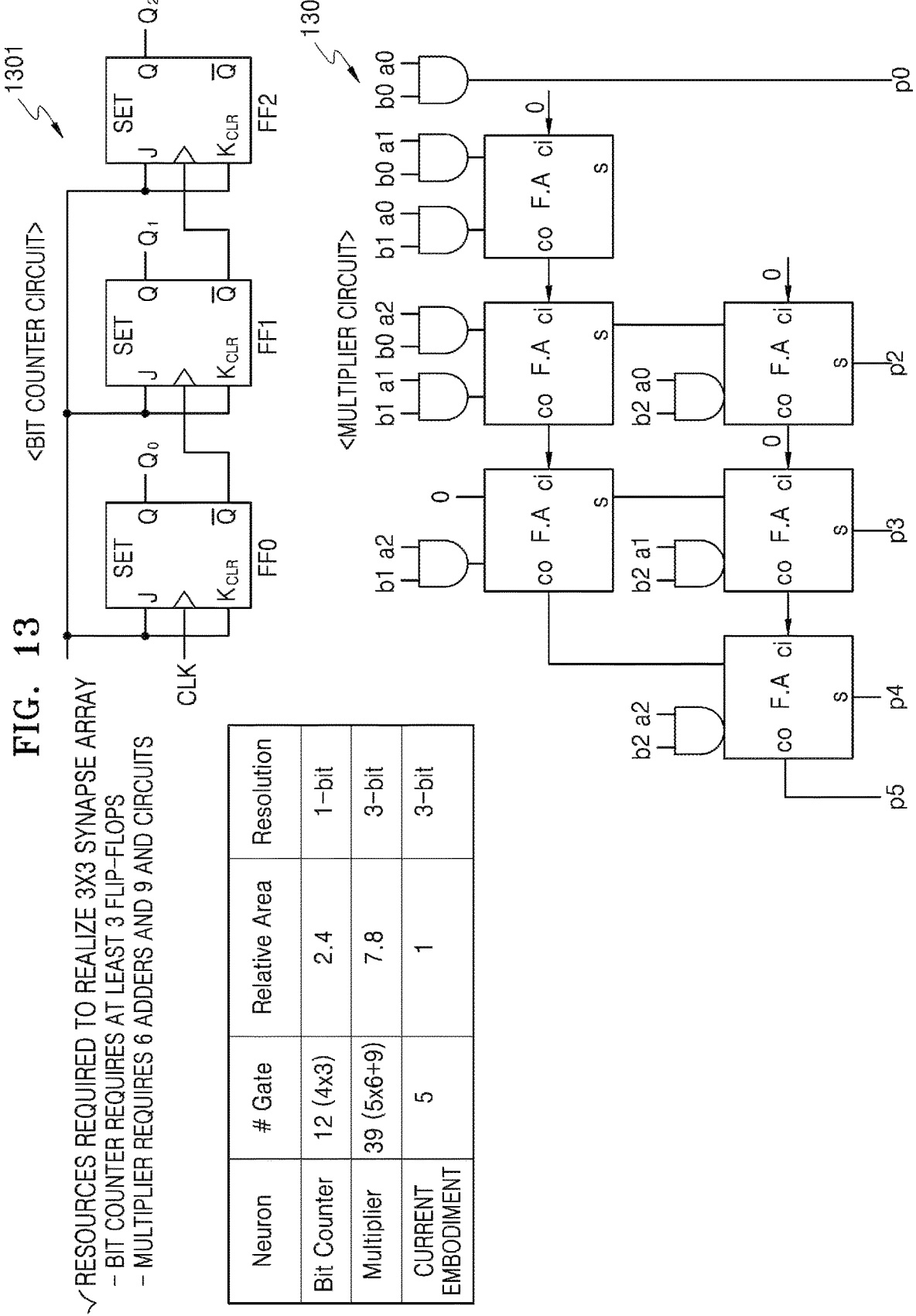
FIG. 13 is a diagram of an example describing hardware resources of a neuromorphic processor in comparison with hardware resources of general neuromorphic processors.

FIG. 13 is a diagram of an example describing hardware resources of the neuromorphic processor 112 in comparison with hardware resources of general neuromorphic processors.

Referring to FIG. 13, a general neuromorphic processor using the method described with reference to FIG. 7C performs addition or integration on synaptic operation values received by using a bit counter 1303 included in a neuron circuit. However, the general neuromorphic processor using the bit counter 1301 is unable to perform a multi-bit neuromorphic operation (multi-bit multiplication operation). Meanwhile, there is a general neuromorphic processor that uses a multiplier circuit 1302 included in a neuron circuit for the multi-bit multiplication operation.

However, comparing hardware resources of such general neuromorphic processors with hardware resources of the neuromorphic processor 112 according to the current example, unlike the general neuromorphic processors, examples of the neuromorphic processor 112 may include those realizing a circuit with a small area by using fewer circuit devices while simultaneously being capable of multi-bit multiplication operations.

Figure 14:
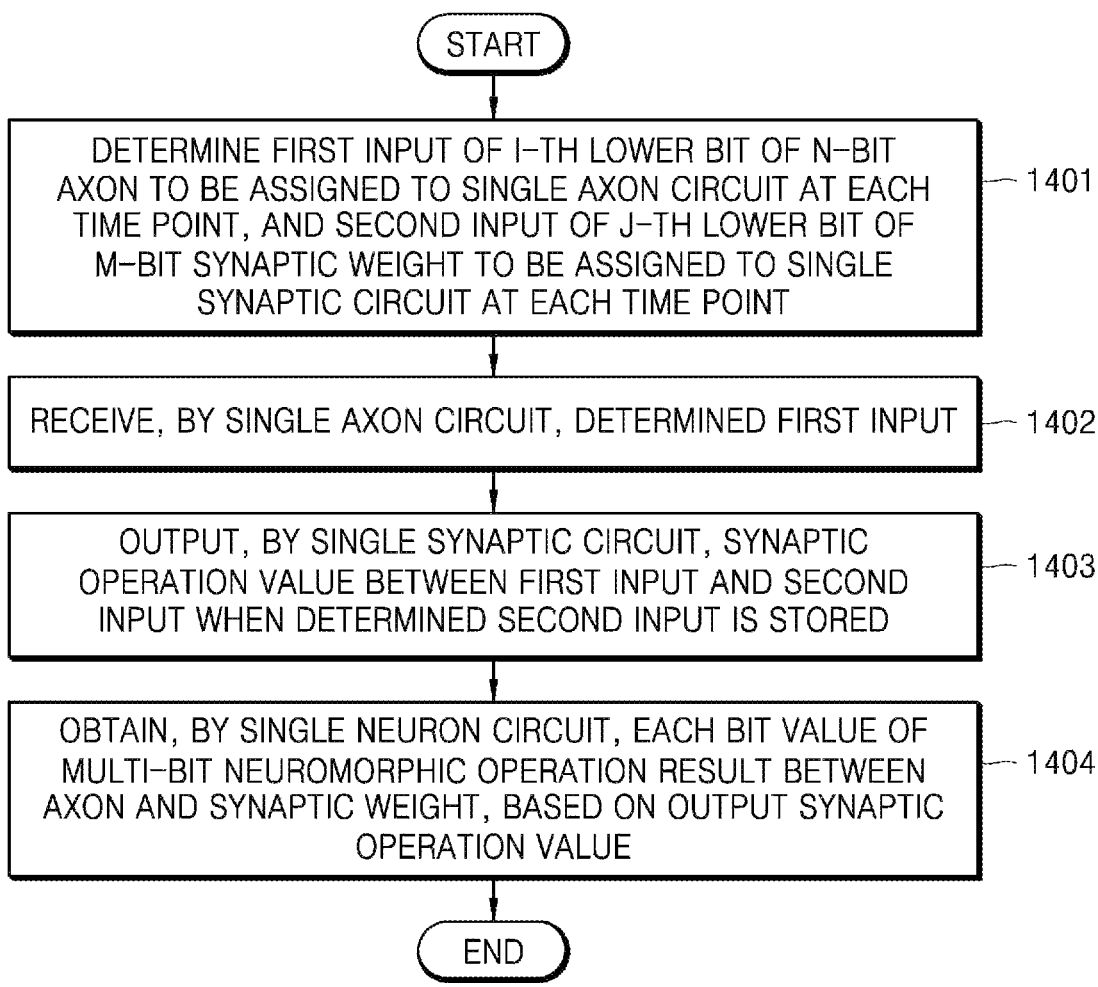
FIG. 14 is a flowchart of an example of a method, performed by a neuromorphic apparatus, of processing a multi-bit neuromorphic operation.

FIG. 14 is a flowchart of an example of a method, performed by the neuromorphic apparatus 100, of processing a multi-bit neuromorphic operation. Referring to FIG. 14, the method includes operations processed by the neuromorphic apparatus 100 described above in time-series. Thus, the details described above are applicable to the method of FIG. 14.

In operation 1401, the controller 1124 of the neuromorphic apparatus 100 determines the first input of the i-th lower bit of the n-bit axon to be assigned to the single axon circuit 1121 at each time point, and the second input of the j-th lower bit of the m-bit synaptic weight to be assigned to the single synaptic circuit 1122 at each time point. Here, the controller 1124 may repeatedly determine the first input and the second input to be assigned at each time point until the multi-bit neuromorphic operation result is obtained sequentially from the lower bit value to the upper bit value.

In operation 1402, the single axon circuit 1121 receives the determined first input.

In operation 1403, the single synaptic circuit 1122 outputs the synaptic operation value between the first input and the second input when the determined second input is stored.

In operation 1404, the single neuron circuit 1123 obtains each bit value of the multi-bit neuromorphic operation result between the axon and the synaptic weight, based on the output synaptic operation value.

Figure 15:
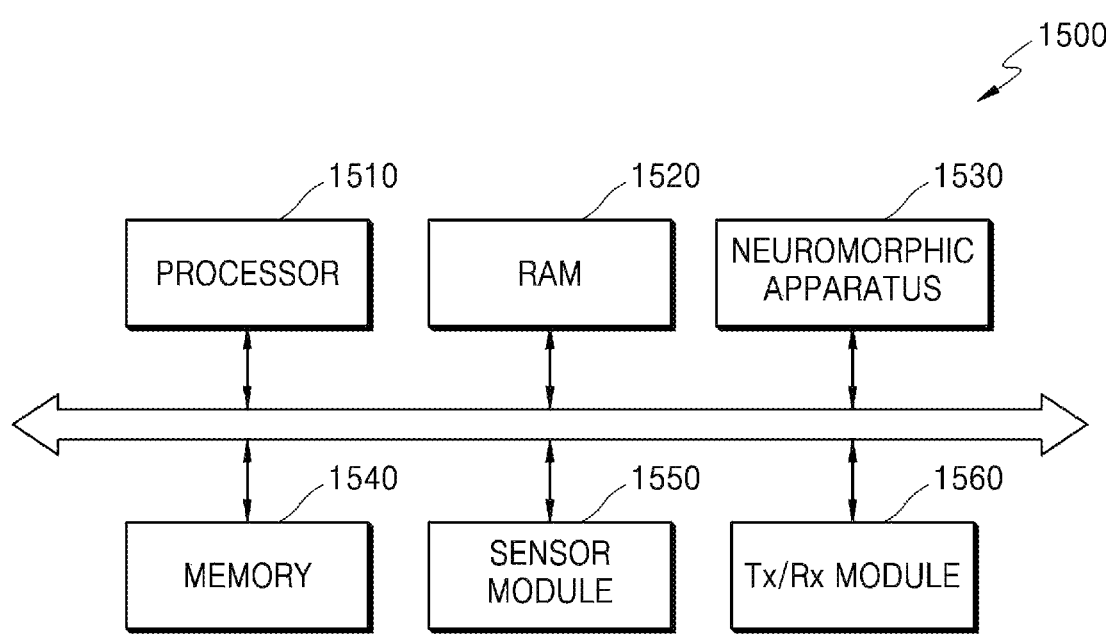
FIG. 15 is a block diagram of an example of a configuration of an electronic system.

FIG. 15 is a block diagram of an example of a configuration of an example electronic system 1500.

Referring to FIG. 15, the electronic system 1500 may extract valid information by analyzing input data in real-time based on a neural network, and determine a situation based on the extracted valid information or control components of an electronic device on which the electronic system 1500 is mounted or is representative of. For example, the electronic system 1500 may be applied to a robot apparatus, such as a drone or an advanced drivers assistance system (ADAS), a smart TV, a smart phone, a medical device, a mobile device, an image display device, a measuring device, or an IoT device, and may be mounted on at least one of various types of electronic devices.

The electronic system 1500 may include a processor 1510, a RAM 1520, a neuromorphic apparatus 1530, a memory 1540, a sensor module 1550, and a communication (Tx/Rx) module 1560. The electronic system 1500 may further include an input/output module, a security module, a power control device, etc. At least some of hardware components of the electronic system 1500 may be mounted on at least one semiconductor chip.

The processor 1510 controls overall operations of the electronic system 1500. The processor 1510 may include one processor core (single core) or a plurality of processor cores (multi-core). The processor 1510 may process or execute programs and/or data stored in the memory 1540. According to an example, the processor 1510 may execute the programs stored in the memory 1540 to control functions of the neuromorphic apparatus 1530. The processor 1510 may be a central processing unit (CPU), a graphics processing unit (GPU), or an application processor (AP).

The RAM 1520 may temporarily store programs, data, or instructions. For example, the programs and/or data stored in the memory 1540 may be temporarily stored in the RAM 1520 according to control or a booting code of the processor 1510. The RAM 1520 may be realized as a memory, such as DRAM or SRAM.

The neuromorphic apparatus 1530 may implement a neural network based on received input data and generate an information signal based on a result of implementing the operation. The neural network may include CNN, RNN, FNN, deep belief network, restricted Boltzmann machines, etc., but is not limited to these examples. The neuromorphic apparatus 1530 may be a neural network-exclusive hardware accelerator or a device including the same, and may include the neuromorphic apparatus 100 of FIG. 4 described above.

The information signal may include one of the various types of recognition signals, such as a voice recognition signal, an object recognition signal, an image recognition signal, a biometric information recognition signal, etc. For example, the neuromorphic apparatus 1530 may receive frame data included in a video stream as input data, and generate a recognition signal with respect to an object included in an image indicated by the frame data. However, an embodiment is not limited to these examples, and the neuromorphic apparatus 1530 may receive any type of input data and generate a recognition signal according to the input data, based on a type or function of an electronic apparatus on which the electronic system 1500 is mounted.

The memory 1540 is a storage space for storing data, and may store an operating system (OS), various programs, and various types of data. According to an embodiment, the memory 1540 may store intermediate results generated while during operations of the neuromorphic apparatus 1530.

The memory 1540 may be DRAM, but is not limited to these examples. The memory 1540 may include at least one of a volatile memory and a nonvolatile memory. Examples of the nonvolatile memory include ROM, PROM, EPROM, EEPROM, a flash memory, PRAM, MRAM, RRAM, and FRAM. Examples of the volatile memory include DRAM, SRAM, SDRAM, PRAM, MRAM, RRAM, and FeRAM. According to an embodiment, the memory 1540 may include at least one of HDD, SSD, CF, SD, Micro-SD, Mini-SD, xD, and a memory stick The sensor module 1550 may collect surrounding information of the electronic apparatus on which the electronic system 1500 is mounted. The sensor module 1550 may sense or receive a signal (for example, an image signal, a voice signal, a magnetic signal, a biometric signal, or a touch signal) from outside the electronic apparatus, and convert the sensed or received signal to data. In this regard, the sensor module 1550 may include at least one of various types of sensing devices, such as a microphone, an image pickup device, an image sensor, light detection and ranging (LIDAR) sensor, an infrared sensor, an ultrasound sensor, a bio-sensor, and a touch sensor.

The sensor module 1550 may provide the converted data to the neuromorphic apparatus 1530 as input data, or in an example is included in the neuromorphic apparatus 1530. For example, the sensor module 1550 may include an image sensor, and may generate a video stream by photographing an external environment of the electronic apparatus and sequentially obtain or provide consecutive data frames of the video stream to the neuromorphic apparatus 1530 as the input data. However, an embodiment is not limited to these examples, and the sensor module 1550 may provide various types of data to the neuromorphic apparatus 1530.

The Tx/Rx module 1560 may include various wired or wireless interfaces capable of communicating with an external device. For example, the Tx/Rx module 1560 may include a local area network (LAN), a wireless LAN (WLAN) such as wireless fidelity (Wi-Fi), a wireless personal area network (WPAN) such as Bluetooth, and communication interfaces capable of accessing a mobile cellular network, such as wireless universal serial bus (USB), Zig-Bee, near field communication (NFC), radio-frequency identification (RFID), power line communication (PLC), $3^{rd}$ generation (3G), $4^{th}$ generation (4G), or long-term evolution (LTE).

The neuromorphic processors 112, the processor 1510, the RAM 1520, the neural network device 1530, the memory 1540, the sensor module 1550, and the Tx/Rx module 1560 in FIGS. 1-15 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIGS. 1-15 that performs the operations described in this application is performed by computing hardware, for example, by one or more processors or computers, implemented as described above executing instructions or software to perform the operations described in this application that are performed by the method. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable rage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A neuromorphic apparatus configured to process a multiplication operation, the neuromorphic apparatus comprising:
    a neuromorphic processor comprising:
        a synaptic circuit comprising a first memory configured to store a corresponding input bit of an n-bit synaptic weight, and a first processor configured to generate a multiplication operation value between a corresponding input bit of a m-bit input and the stored corresponding input bit of the n-bit synaptic weight; and
        a second processor configured generate a neuromorphic operation result based on a plurality of the multiplication operation values, and selectively output a spike based on the neuromorphic operation result and a preset-threshold; and
    a controller configured to sequentially assign, in a time-division manner, each bit of the n-bit synaptic weight and each bit of the m-bit input to the synaptic circuit, to obtain each of n×m of the multiplication operation values through plural operations of the synaptic circuit,
    wherein n and m are each a natural number.

2. The neuromorphic apparatus of claim 1, wherein the controller is further configured to map i and j such that an i-th bit of the n-bit synaptic weight and a j-th bit of the m-bit input are combined differently for each time period of different time periods.

3. The neuromorphic apparatus of claim 2, wherein the controller is further configured to sequentially change values of i and j of the i-th bit and the j-th bit in an ascending bit value order, until the neuromorphic operation result is generated sequentially from a value of a least significant bit (LSB) to a value of a most significant bit (MSB).

4. The neuromorphic apparatus of claim 2, wherein a total number of combinations of the i-th bit and the j-th bit corresponds to a value obtained by multiplying n by m.

5. The neuromorphic apparatus of claim 1, wherein the neuromorphic processor further comprises a second memory configured to receive and provide each sequentially assigned bit of the m-bit input to the synaptic circuit, and wherein the second memory and the synaptic circuit each process a single bit value for each time period of different time periods.

6. The neuromorphic apparatus of claim 1, wherein the second processor comprises an adder configured to perform an addition operation using the multiplication operation values output from the synaptic circuit for each time period of different time periods.

7. The neuromorphic apparatus of claim 6, wherein the second processor is configured to generate each bit value of the neuromorphic operation result using the adder to perform the addition operation using, as inputs, at least one of a pre-set initial value, a multiplication operation value output from the synaptic circuit at a previous time period of the different time periods, a multiplication operation value output from the synaptic circuit at a current time period of the different time periods, an addition value processed by the adder at a previous time period of the different time periods, and a carry value determined by the adder at a previous time period of the different time periods.

8. The neuromorphic apparatus of claim 6, wherein at least one of an addition value and a carry value output from the adder corresponds to a value of one of bits of the neuromorphic operation result.

9. The neuromorphic apparatus of claim 6, wherein the adder is reused to obtain a value of another one of bits of the neuromorphic operation result after a value of one of the bits of the neuromorphic operation result is generated.

10. The neuromorphic apparatus of claim 6, wherein the adder is further configured to perform the addition operation by receiving, as inputs, multiplication operation values from the synaptic circuit corresponding to same bit positions between intermediate products for generating the neuromorphic operation result.

11. The neuromorphic apparatus of claim 1, wherein the second processor comprises a comparator configured to determine whether to output the spike by comparing the neuromorphic operation result with the pre-set threshold value upon generation of each bit of the neuromorphic operation result.

12. A neuromorphic chip comprising the neuromorphic apparatus of claim 1 and a memory storing multiple n-bit synaptic weights and multiple m-bit inputs, including the n-bit synaptic weight and multiple m-bit input.

13. A multi-bit neuromorphic operation method, the method comprising:

generating each of n×m multiplication operation values in a time-division manner by, for each of a plurality of times:

determining a corresponding bit of an n-bit synaptic weight and a corresponding bit of a m-bit input that are sequentially assigned to a first processor in the time-division manner, where n and m are each a natural number;

generating by the first processor, a multiplication operation value between the determined bit of the n-bit synaptic weight and the determined bit of the m-bit input;

generating a neuromorphic operation result between the n-bit synaptic weight and the m-bit input based on each of the generated n×m multiplication operation values: and selectively outputting a spike based on the neuromorphic operation result and a preset-threshold.

14. The method of claim 13, wherein i and j are determined such that an i-th bit of the n-bit synaptic weight and a j-th bit of the m-bit input are combined differently for each time period of different time periods.

15. The method of claim 14, wherein values of i of the i-th bit and j of the j-th bit sequentially are changed in an ascending bit value order, until the neuromorphic operation result is generated sequentially from a value of a least significant bit (LSB) to a value of a most significant bit (MSB).

16. The method of claim 14, wherein a total number of combinations of the i-th bit and the j-th bit corresponds to a value obtained by multiplying n by m.

17. The method of claim 13, wherein the generating of the neuromorphic operation result comprises generating each bit value of the neuromorphic operation result based on an addition operation of an adder using the multiplication operation values generated by the first processor for each time period of different time periods.

18. The method of claim 17, wherein the generating of the neuromorphic operation result comprises generating the each bit value of the neuromorphic operation result using the adder to perform an addition operation using, as inputs, at least one of a pre-set initial value, a multiplication operation value output from the first processor at a previous time period of the different time periods, a multiplication operation value output from the first processor at a current time period of the different time periods, an addition value processed by the adder at a previous time period of the different time periods, and a carry value determined by the adder at a previous time period of the different time periods.

19. The method of claim 17, wherein the generating of the neuromorphic operation result further comprises performing the addition operation by receiving, as inputs of the adder, synaptic operation values corresponding to same bit positions between intermediate products for generating the neuromorphic operation result.

20. The method of claim 13, wherein the selective outputting of the spike comprises determining whether to output the spike by comparing the neuromorphic operation result with the pre-set threshold value upon generation of each bit of the neuromorphic operation result.

* * * * *